(12) United States Patent
Kamphuis et al.

(10) Patent No.: US 10,431,575 B2
(45) Date of Patent: Oct. 1, 2019

(54) MULTI-DIE ARRAY DEVICE

(71) Applicant: NXP B.V., Eindhoven (NL)

(72) Inventors: Antonius Hendrikus Jozef Kamphuis, Lent (NL); Jeroen Johannes Maria Zaal, Nijmegen (NL); Johannes Henricus Johanna Janssen, Venray (NL); Amar Ashok Mavinkurve, Malden (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/846,425

(22) Filed: Dec. 19, 2017

(65) Prior Publication Data
US 2019/0189606 A1 Jun. 20, 2019

(51) Int. Cl.
| | |
|---|---|
| H01L 25/00 | (2006.01) |
| H01L 21/66 | (2006.01) |
| H01L 21/56 | (2006.01) |
| H01L 21/683 | (2006.01) |
| H01L 23/31 | (2006.01) |
| H01L 23/00 | (2006.01) |
| H01L 23/538 | (2006.01) |
| H01L 25/18 | (2006.01) |

(Continued)

(52) U.S. Cl.
CPC ............ *H01L 25/50* (2013.01); *H01L 21/563* (2013.01); *H01L 21/568* (2013.01); *H01L 21/6835* (2013.01); *H01L 22/22* (2013.01); *H01L 22/32* (2013.01); *H01L 23/3185* (2013.01); *H01L 23/5386* (2013.01); *H01L 24/16* (2013.01); *H01L 25/18* (2013.01); *H01L 23/3675* (2013.01); *H01L 23/427* (2013.01); *H01L 2221/68368* (2013.01); *H01L 2221/68381* (2013.01); *H01L 2224/16227* (2013.01); *H04B 1/04* (2013.01); *H04B 1/16* (2013.01); *H04B 1/40* (2013.01)

(58) Field of Classification Search
None
See application file for complete search history.

(56) References Cited

U.S. PATENT DOCUMENTS

| | | |
|---|---|---|
| 7,048,450 B2 | 5/2006 | Beer et al. |
| 8,409,926 B2 | 4/2013 | Lin et al. |

(Continued)

FOREIGN PATENT DOCUMENTS

EP    1228157 B1    1/2009

*Primary Examiner* — Anthony Ho
*Assistant Examiner* — Kevin Quinto
(74) *Attorney, Agent, or Firm* — Senaida B. San Miguel

(57) ABSTRACT

Embodiments are provided that include a method for fabricating a multi-die package including: placing a plurality of flip chip dies and splitter dies on the sacrificial carrier; performing solder reflow to join solder bumps of each flip chip die and each splitter die to the sacrificial carrier that includes test probe circuitry; testing the flip chip and splitter dies; replacing any faulty dies; overmolding the flip chip and splitter dies on the sacrificial carrier to form a panel of embedded dies; planarizing the panel of embedded dies to expose back surfaces of the embedded dies; forming a metallization layer across the back surface of the panel of embedded dies; and removing the sacrificial carrier to expose a front surface of the panel of embedded dies, wherein a contact surface of each solder bump of each flip chip die and splitter die is exposed in the front surface.

19 Claims, 14 Drawing Sheets

(51) Int. Cl.
    *H04B 1/40*      (2015.01)
    *H01L 23/367*    (2006.01)
    *H01L 23/427*    (2006.01)
    *H04B 1/04*      (2006.01)
    *H04B 1/16*      (2006.01)

(56) References Cited

U.S. PATENT DOCUMENTS

| | | |
|---|---|---|
| 8,535,978 B2 | 9/2013 | Scanlan |
| 8,669,655 B2 | 3/2014 | Geitner et al. |
| 8,922,021 B2 | 12/2014 | Scanlan |
| 9,000,587 B1 | 4/2015 | Kelkar et al. |
| 9,305,908 B2 | 4/2016 | Krabe et al. |
| 9,337,086 B2 | 5/2016 | Scanlan |
| 9,425,175 B2 | 8/2016 | Krabe et al. |
| 9,469,524 B2 | 10/2016 | Cheng et al. |
| 9,496,195 B2 | 11/2016 | Lin et al. |
| 2003/0155637 A1* | 8/2003 | Amura ............... H01L 23/3675 257/675 |
| 2007/0184581 A1* | 8/2007 | Hsu ................... H01L 23/3677 438/108 |
| 2013/0280826 A1* | 10/2013 | Scanlan ............... H01L 23/544 438/15 |
| 2016/0322273 A1 | 11/2016 | Wu et al. |
| 2017/0077072 A1 | 3/2017 | Yap |

\* cited by examiner

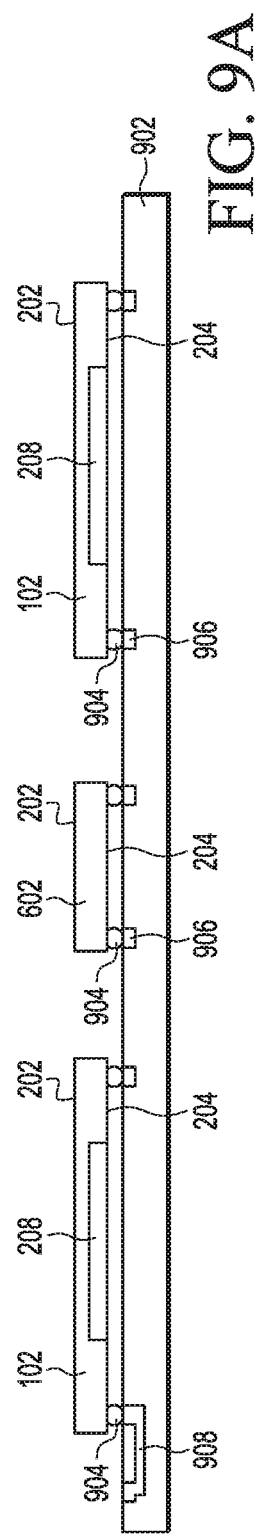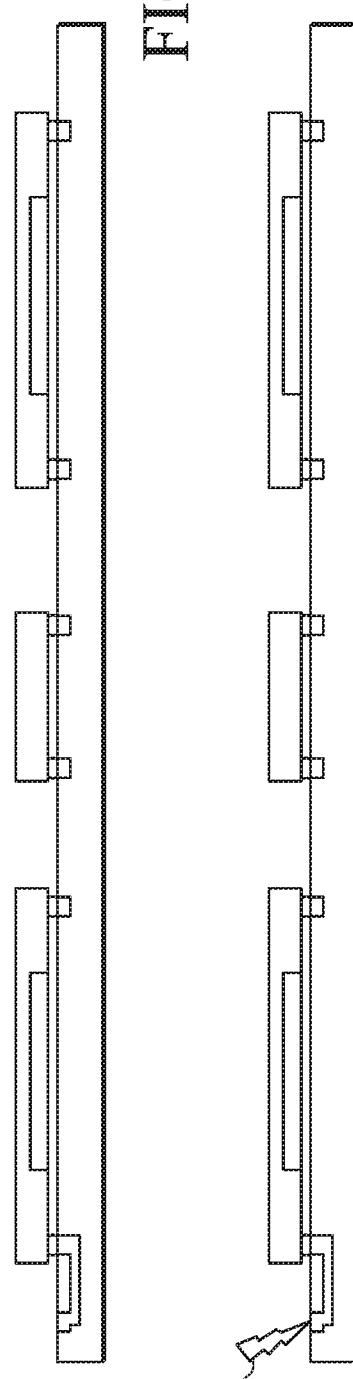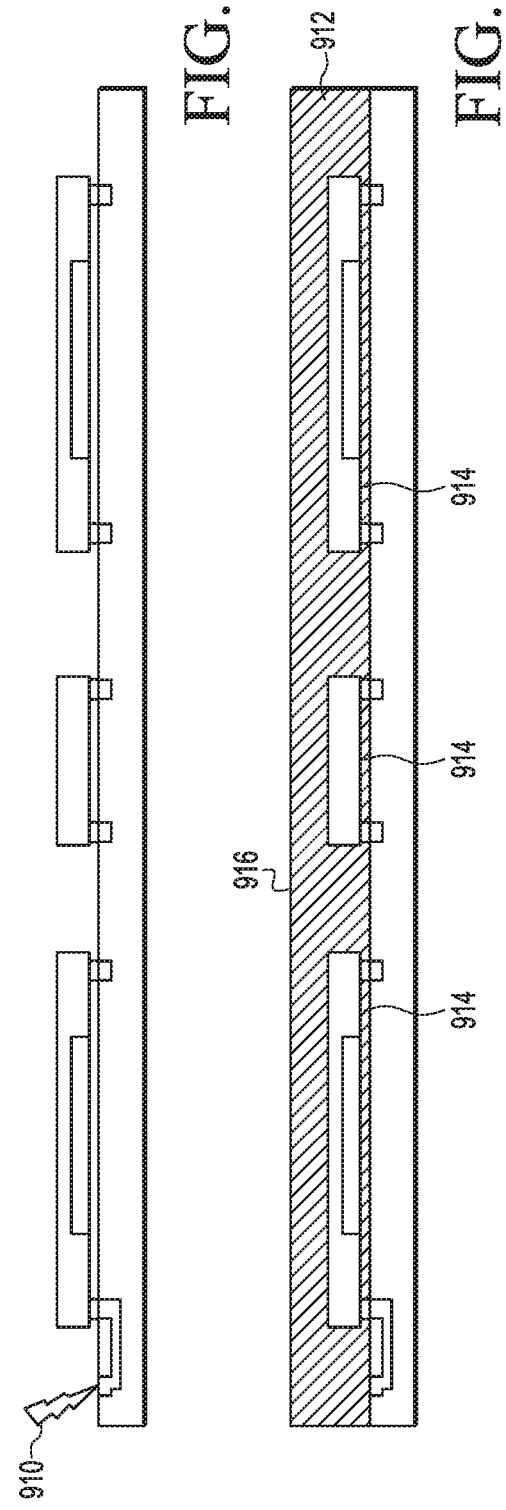

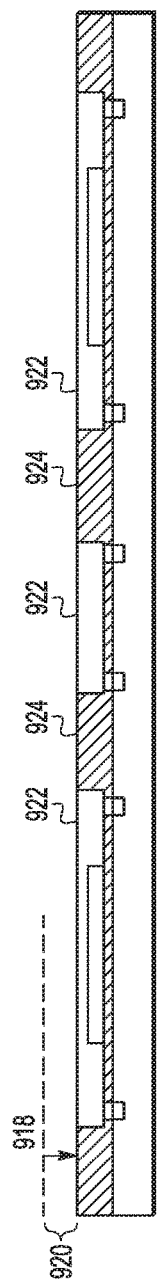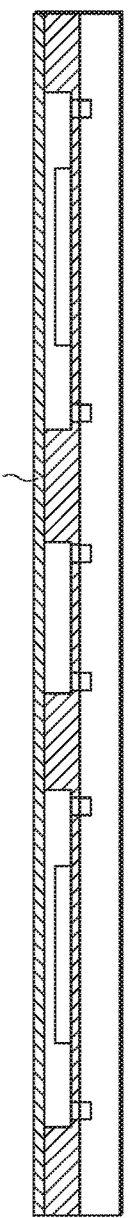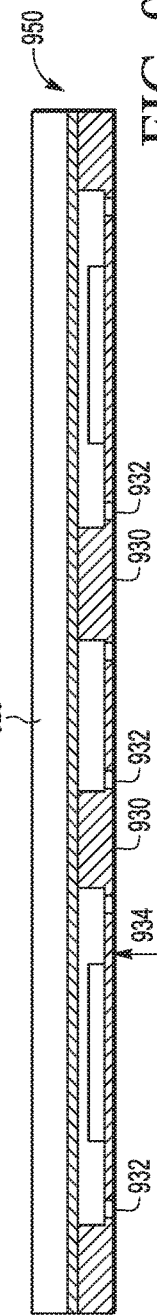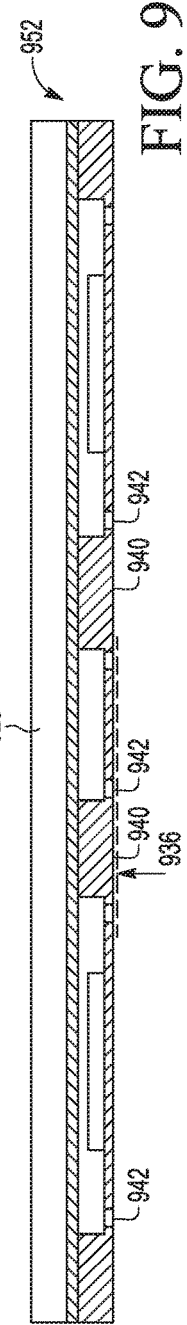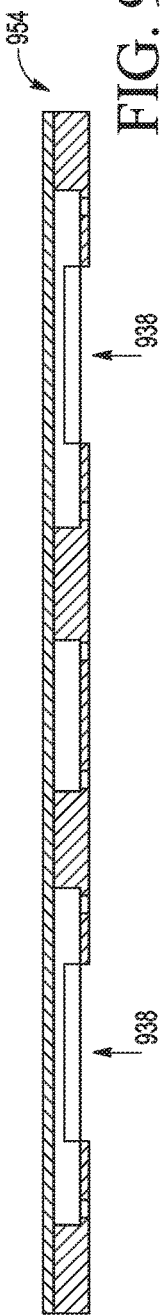

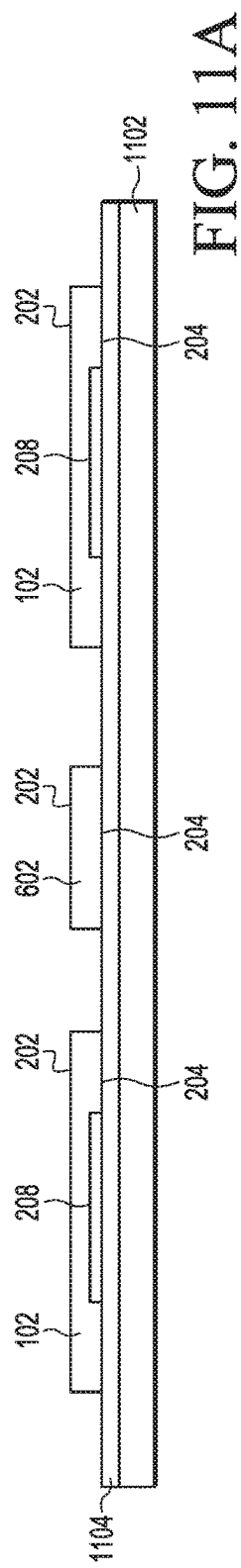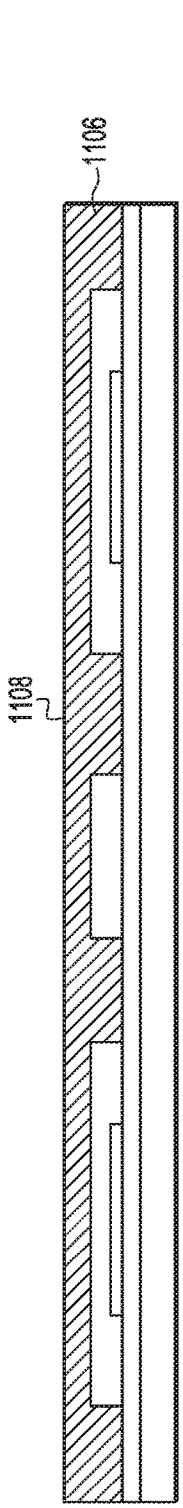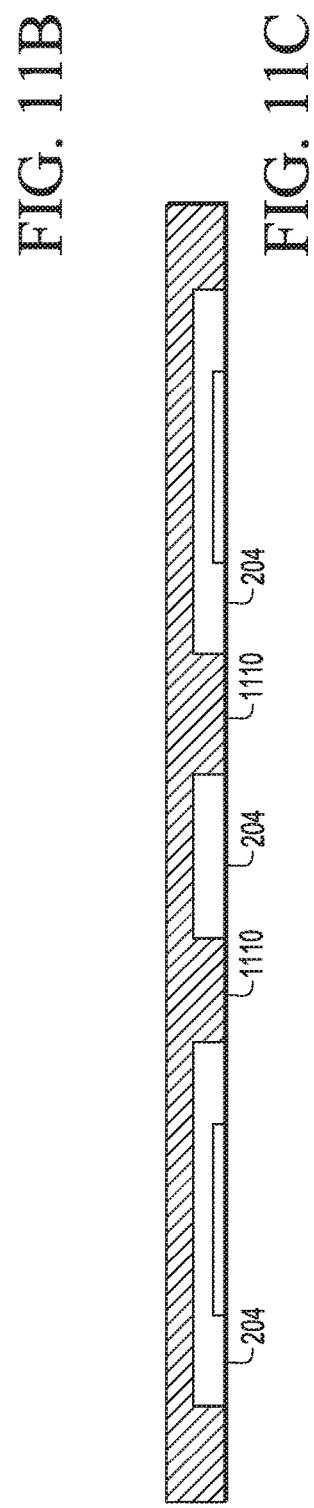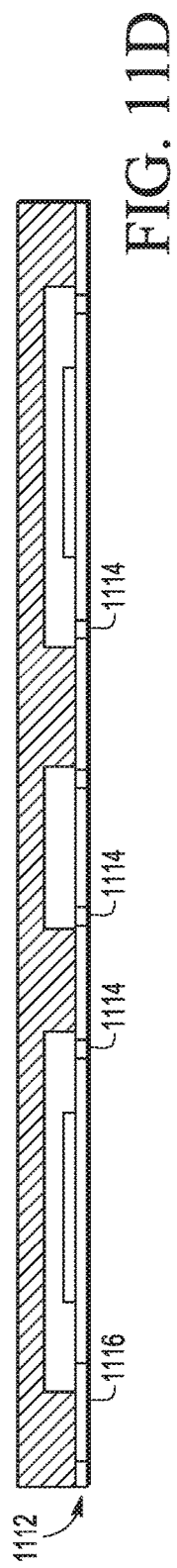

MULTI-DIE ARRAY DEVICE

BACKGROUND

Field

This disclosure relates generally to wireless communication, and more specifically, to providing a packaged semiconductor device that includes an array of multiple die configured to control an array of antennas for wireless communication.

Related Art

Wireless communication is used in a variety of applications for data transfer, such as mobile telephone service. Wireless communication has made advances in increasing the amount of data transferred, such as by moving to new technologies that include multi-in, multi-out (MIMO) and millimeter waves (mmWaves).

BRIEF DESCRIPTION OF THE DRAWINGS

The present invention may be better understood, and its numerous objects, features, and advantages made apparent to those skilled in the art by referencing the accompanying drawings.

FIG. 9A-9I are block diagrams depicting an example process flow for creating a packaged semiconductor device that includes an array of RF cells, according to some embodiments of the present disclosure.

FIG. 11A-11I are block diagrams depicting another example process flow for creating a packaged semiconductor device that includes an array of RF cells, according to some embodiments of the present disclosure.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
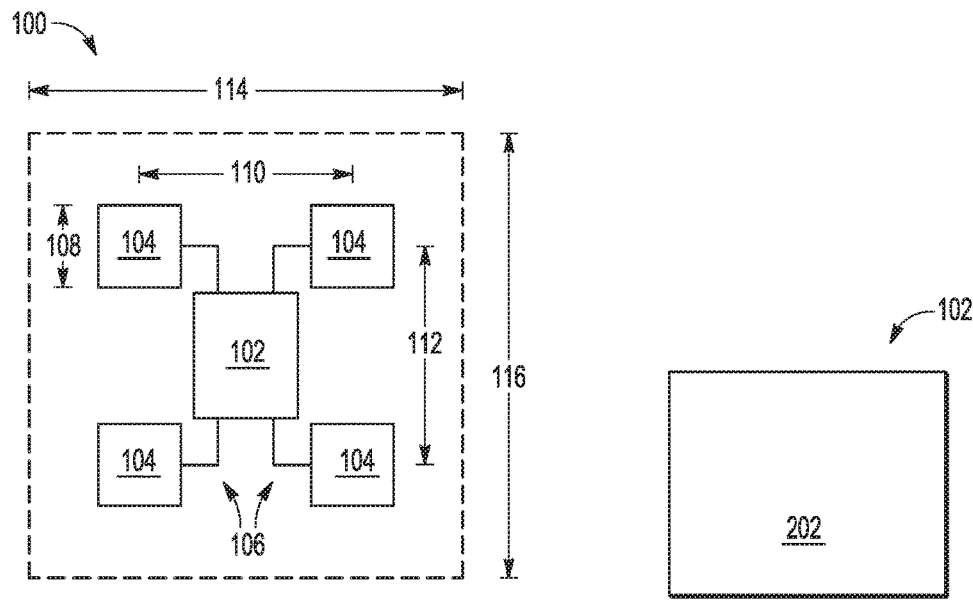
FIGS. 1, 2, 3, and 4 are block diagrams depicting components of an example radio frequency (RF) cell coupled to a number of antennas, according to some embodiments of the present disclosure.

The following sets forth a detailed description of various embodiments intended to be illustrative of the invention and should not be taken to be limiting.

Overview

MIMO (multi-in, multi-out) technology is an important technology for implementing advanced wireless communication, such as for 5G (5$^{th}$ generation) networks. An array of antennas is used to achieve large data transfer, where the antennas are controlled by a number of radio frequency (RF) die. As the number of antennas implemented in an array increases, so does the number of RF dies needed in a wireless communication device. However, the RF dies in aggregate generate a great amount of heat, and requires a thermal transfer solution. The thermal performance of a wireless communication device is presently a limiting factor for the number of RF dies implemented in a single wireless communication device, which in turn limits the data transfer capabilities of the wireless communication device.

Further, a customer conventionally attaches each RF die individually on a printed circuit board (PCB) to form a wireless communication device. As the number of RF dies implemented in such a device increases, so does the risk of non-planarity among the RF dies. For example, each RF die may have some degree of tilt or variations in the solder bump height when attached to the PCB. The non-planarity of the RF dies may limit the thermal transfer from the (non-planar) sides of each RF die to a planar surface of a heat sink or spreader. While such tilt or variations may be compensated with a thick thermal interface material, the larger thickness increases the thermal conductivity path from the RF dies to the heat sink and reduces thermal performance.

The present disclosure provides embodiments of packaged semiconductor devices and embodiments of fabricating such devices that include an array of RF dies, which may include hundreds of dies. The presently disclosed device has an active surface that is configured to be directly attached to a printed circuit board (PCB) that implements an array of antennas. The active surface is a planar surface that may be attached to the PCB by solder bumps, solder balls, or other solder attachment mechanism. The device also has a planar back surface that can be joined to a cooling system, such as a heat pipe or other thermal transfer mechanism, where a thinned back side of each RF die is exposed in the planar back surface. A direct thermal conductivity path is formed between each die and the cooling system to dissipate more power in the presently included RF dies for improved thermal performance, which also increases the life span of the presently disclosed device (e.g., due to lower operating temperature). Improved thermal performance may also allow additional RF dies to be included in the presently disclosed device, providing for increased RF power capability.

In some embodiments of the fabrication process described herein, a sacrificial carrier with testing circuitry is used to test the die before overmolding is performed, allowing for any faulty die to be detected and replaced before overmolding, which improves yield and reliability of the resulting device. In some embodiments, any dielectric material (such as mold compound, underfill, or dielectric RDL layer) may be removed from an RF-sensitive area on each RF die, providing improved RF performance. In some embodiments, the fabrication process may also form conductive traces or signal lines in the device to minimize the number of transitions between the PCB and the device for improved RF performance.

The present disclosure may be especially beneficial for devices that implement an operating frequency at microwave frequencies or millimeter frequencies (or frequencies that have millimeter wavelengths). The packaged semiconductor devices disclosed herein may be implemented in wireless communication devices, such as routers, base stations for cell phone systems, network devices that implement wireless communication (e.g., 5G), and the like.

Example Embodiments

FIG. 1 illustrates an example radio frequency (RF) cell 100, which includes an RF die 102 configured to process RF signals at an operating frequency, which has a wavelength or lambda (λ). Examples of operating frequencies include but are not limited to frequencies that generally fall in a range of 20 kHz to 300 GHz, such as a band centered on 13.56 MHz, a band centered on 3.6 GHz, a band centered on 5 GHz, or a band centered on 60 GHz. RF die 102 may implement RF front-end circuitry, which implements front end components of a transmitter, a receiver, or both, as further discussed below in connection with FIG. 2.

Figure 2:
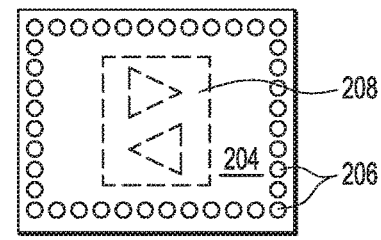

FIG. 2 shows a back side 202, an active side 204, and a lateral side 210 of an RF die 102, which is also referred to as a flip chip die that is configured to be connected to a PCB or other substrate in a face-down orientation (e.g., active side facing the PCB). The active side 204 of RF die 102 includes active circuitry having signal paths routed to bond pads on the active side 204, and the back side 202 (e.g., bulk silicon) is opposite the active side 204. In the embodiment shown, a plurality of solder bumps 206 are attached to the bond pads on the active side 204. While the solder bumps 206 are shown attached to bond pads arranged in rows around the periphery of the die 102, the solder bumps 206 may be attached to bond pads arranged in other shapes and in other areas on the die 102. The active circuitry also includes an RF-sensitive area 208, which is shown in dashed outline in FIG. 2. The RF-sensitive area 208 may include front-end circuitry (also shown in dashed outline) that includes a transmitter circuit, a receiver circuit, or both as a transceiver circuit. The front-end circuitry may include but is not limited to a transmitter power amplifier, a receiver low noise amplifier, one or more baluns, one or more filters, a circulator or other coupling device to the antenna, impedance matching elements, a local oscillator, a phase locked loop, a resonance frequency circuit (e.g., one or more resistors and capacitors), control logic, and other appropriate front-end elements.

Returning to FIG. 1, the RF die 102 of the RF cell 100 is coupled to a set of antennas 104 by respective interconnects 106 contacting ones of the solder bumps 206, where the RF die 102 may provide an RF signal to each antenna 104 for transmission (e.g., output by a transmitter circuit in area 208), may receive an RF signal from each antenna 104 (e.g., input to a receiver circuit in area 208), or both. In the embodiments discussed herein, the set of antennas 104 includes 4 antennas, but other numbers of antennas may be implemented in other embodiments (e.g., 2, 6, 8). The RF die 102 may be configured to implement a MIMO (multi-in, multi-out) technique that uses multiple transmit and receive antennas for multipath propagation. In the embodiments discussed herein, the antennas 104 are implemented on a printed circuit board (PCB) or other carrier to which the RF die 102 is attached, as further discussed in FIG. 4. In the embodiment shown in FIG. 1, each antenna 104 is a square-shaped patch antenna having a side dimension 108 that is based on the wavelength (λ) of the operating frequency, and may take into account the dielectric constant of the PCB through which the RF signal is transmitted or received. Examples of the side dimension 108 include but are not limited to one-lambda (λ), half-lambda (λ/2), quarter-lambda (λ/4), three-quarter-lambda (3λ/4), or four-lambda (4λ) lengths. The antennas 104 are further discussed below in connection with FIG. 3.

Figure 3:
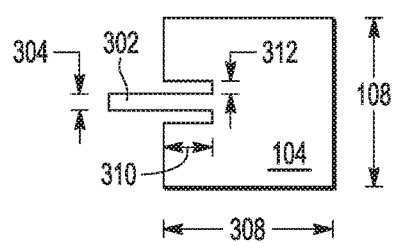

FIG. 3 shows an example rectangular antenna 104, which has a width 108 and a length 308. In some embodiments, the width 108 is equal to the length 308 to provide a square-shaped patch antenna, although the width 108 may be different than the length 308 in other embodiments. In other embodiments, the antenna 104 may be circular, elliptical, or an amorphous shape having a continuous area. The antenna 104 is attached to the interconnect 106 by a microstrip transmission line 302 having a width 304. The microstrip 302 can be tuned or matched to the antenna 104 by the dimensions of the gap separating the microstrip 302 from the surrounding antenna 104, such as gap spacing 312 and the length 310 of the gap. In some embodiments, the antenna 104 may be a quarter-wave element and uses a ground plane in the PCB as a counterpoise to form a half-wave dipole.

Figure 4:
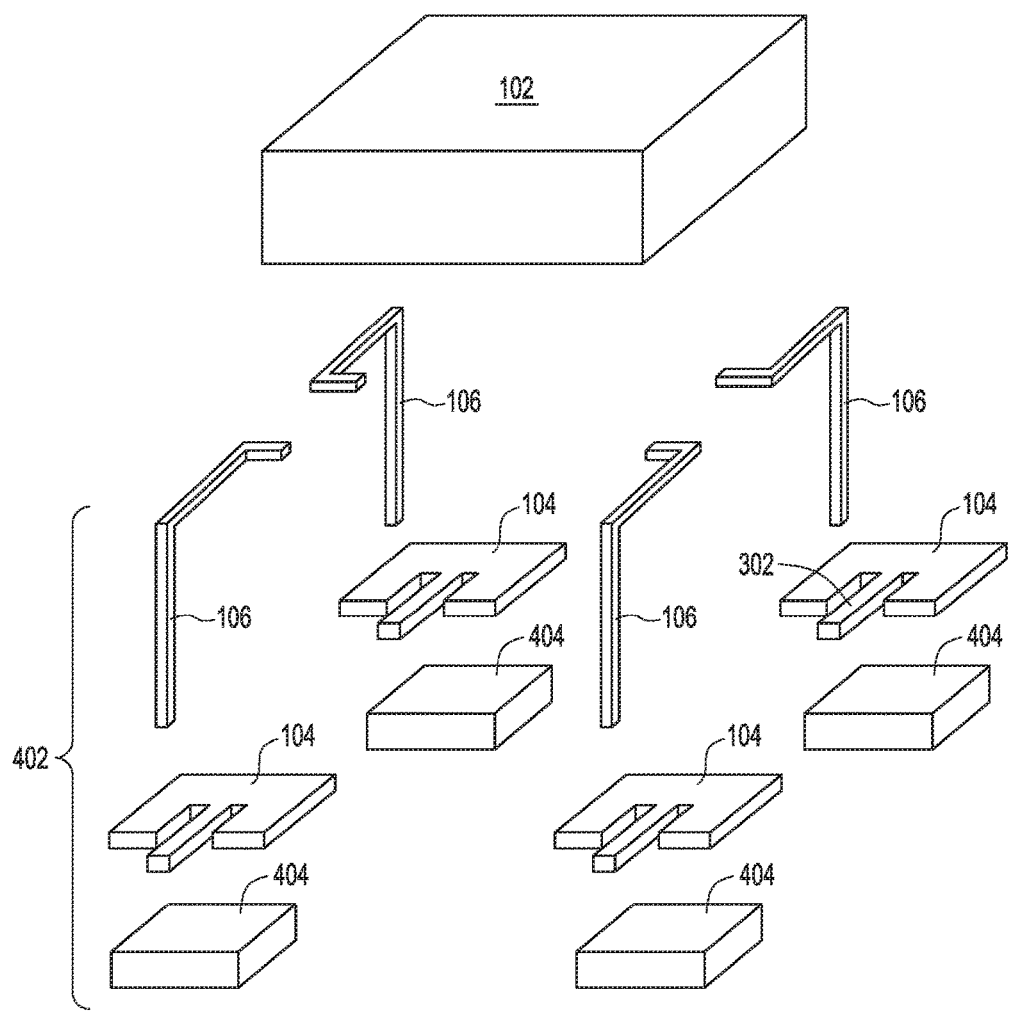

FIG. 4 shows an example exploded view of the RF die 102, the interconnects 106, and the antennas 104. As discussed herein, the interconnects 106 and the antennas 104 are implemented in a printed circuit board (PCB) 402, which is shown without the intervening dielectric layers. In some embodiments, each antenna 104 may be aligned with a reflector 404 configured to reflect an RF signal to the antenna 104 for improved resonance of the antenna 104. Reflector 404 has a greater thickness than antenna 104. Although not shown, a ground plane may also be implemented above or below the antennas 104 in the PCB or grounding elements may be implemented between each antenna 104 in the PCB. A PCB includes electrically conductive features (such as landing pads) on a non-conductive substrate formed by dielectric layers or laminates. A PCB may be a flexible type PCB using polyimide or a rigid type PCB using FR4 or BT resin, or a combination thereof.

Returning to FIG. 1, the set of antennas 104 are arranged in an array of rows and columns (e.g., 2×2) having a pitch 110 in the row direction (e.g., in the left and right directions of the page) and at a pitch 112 in the column direction (e.g., in the top and bottom directions of the page). In some embodiments, the row pitch 110 and the column pitch 112 are based on the wavelength (λ) of the operating frequency and the size of the antennas 104. Examples of the row pitch 110 and the column pitch 112 include but are not limited to one-lambda (λ), half-lambda (λ/2), quarter-lambda (λ/4), three-quarter-lambda (3λ/4), or four-lambda pitches (4λ). The selection of the pitches 110 and 112 is dependent on various factors including but not limited to mutual coupling (which is generally inversely proportional to separation or pitch between the antennas 104) and the appearance of grating lobes (which may appear as a source of interference and power loss). In some embodiments, the row pitch 110 and the column pitch 112 may be the same pitch value to provide an antenna array having uniform pitch. In other embodiments, the row pitch 110 and the column pitch 112 may be different pitch values, such as half-lambda and three-quarter-lambda pitches.

As shown in FIG. 1, the RF cell 100 has a footprint or outer perimeter (shown in dashed lines) having a row length 114 and a column length 116. The footprint of the RF cell 100 is large enough to include the layout of the set of antennas 104 and a portion of the row pitch 110 and column pitch 112, such that the RF cell 100 can be used as a template and repeated (e.g., placed side-to-side in both row and column directions) to form an array of RF cells 100 (also referred to as an RF cell layout) in which the RF dies 102 are arranged with a uniform row pitch and a uniform column pitch (where the uniform row pitch may or may not be equal to the uniform column pitch). The layout of the set of antennas 104 within the RF cell's footprint can also be repeated in a same manner to form (in the PCB) an array of antennas in which antennas are arranged with a uniform row pitch and a uniform column pitch (where the uniform row pitch may or may not be equal to the uniform column pitch). The present disclosure provides a manner of forming a single packaged semiconductor device that includes an array of RF dies 102 arranged according to an RF cell layout, which is configured to be directly attached to the PCB and coupled to a corresponding array of antennas, as further discussed below.

Figure 5:
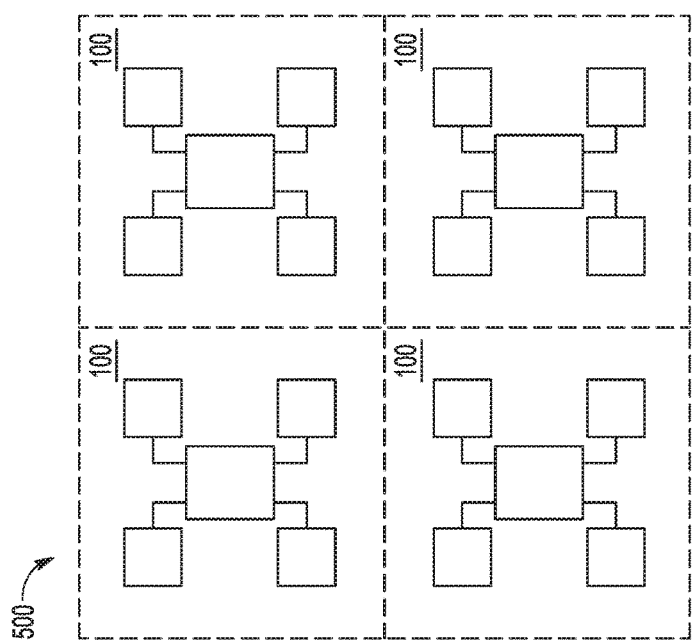
Figure 18:
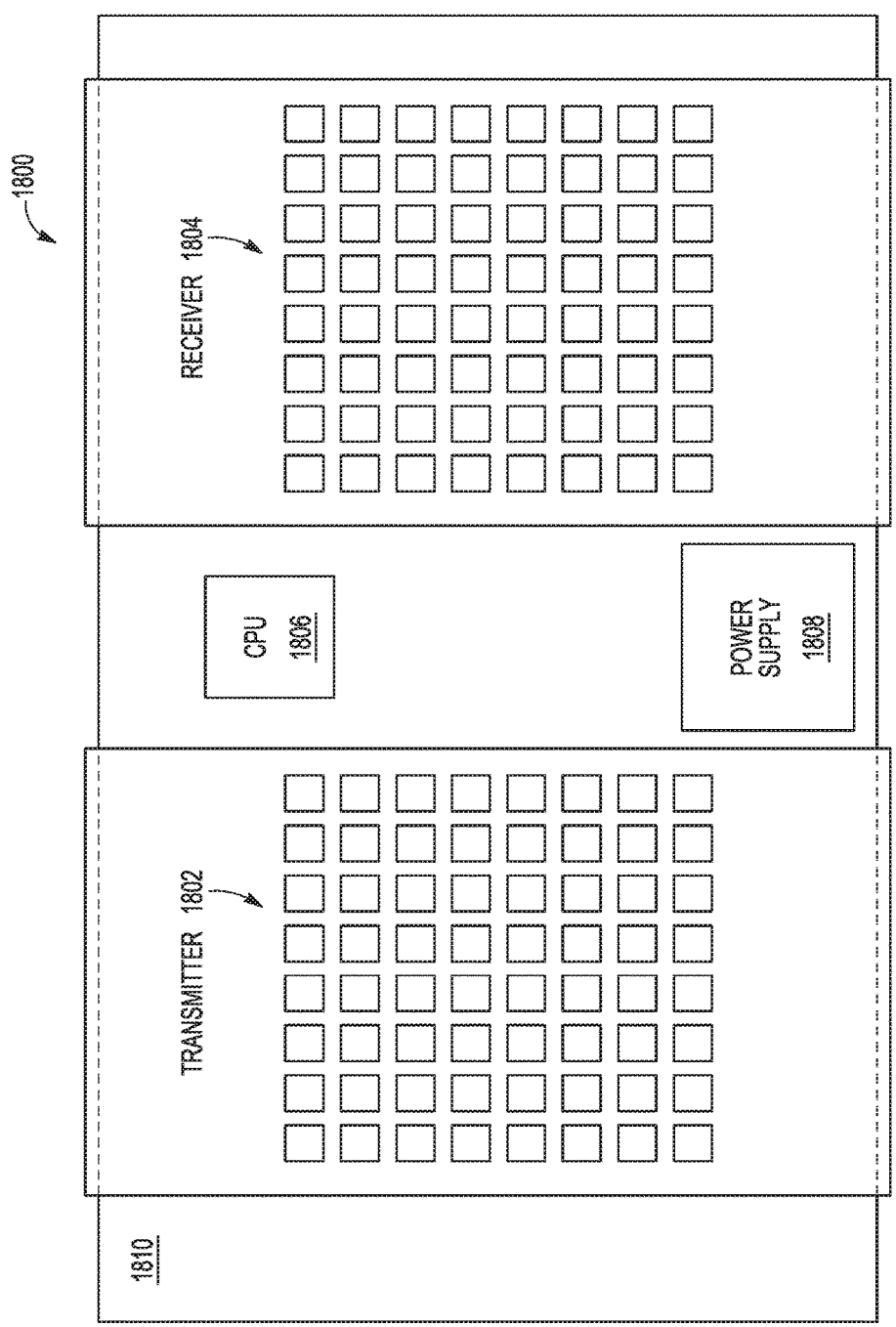
FIG. 18 is a block diagram depicting an example packaged semiconductor device attached to a PCB, according to some embodiments of the present disclosure.

It is noted that any number of RF cells 100 may be implemented in such an array, such as a simple 2×2 arrangement of RF cells 100 shown in FIG. 5. The arrangement of RF cells may be in a variety of shapes, such as rectangular, a circular arrangement (e.g., where the RF dies may or may not be in rows and columns), an amorphous shape (e.g., an N×M number of RF dies but not arranged in rows and columns), and the like. The RF cell layout 500 implements an RF cell array that includes a total of 4 RF dies 102, which are configured to be coupled to a total of 16 antennas 104. Other examples include a 4×8 RF cell array (e.g., 32 RF dies coupled to 128 antennas), an 8×8 RF cells array (e.g., 64 RF dies coupled to 256 antennas), and beyond. In some embodiments, one instance of an RF cell layout may be used to implement an array of RF dies as part of a transmitter, also referred to as a transmitter die array, while another instance array of the RF cell layout may be used to implement another array of RF dies as part of a receiver, also referred to as a receiver die array. For example, FIG. 18 shows a transmitter die array 1802 and a receiver die array 1804 that are each implemented as an N×M die array, N being an integer greater than one and M being another integer greater than one, where N and M need not be equal. In some embodiments, the transmitter die array 1802 may be implemented in one packaged semiconductor device (e.g., 8×8 or 64 RF dies) and the receiver die array 1804 may be implemented in another packaged semiconductor device (e.g., 8×8 or 64 RF dies). In other embodiments, a single packaged semiconductor device may include both the transmitter die array 1802 and the receiver die array 1804 (e.g., 2×8×8 or 128 RF dies).

The one or more packaged semiconductor devices may be used to form a larger packaged device, such as a router or other network device that provides wireless communication. For example, FIG. 18 shows a device 1800 that includes the transmitter die array 1802 and the receiver die array 1804 (either as a single packaged semiconductor device or as two packaged semiconductor devices) attached to a PCB 1810. The transmitter die array 1802 is coupled to a transceiver antenna array implemented in the PCB 1810 and the receiver die array 1804 is coupled to a receiver antenna array implemented in the PCB 1810 (not shown). A central processing unit (CPU) 1806 may also be attached to the PCB 1810, which may be configured to perform signal processing, such as digital signal processing to extract information from received RF signals or generate an RF signal that includes information for transmission. A power supply 1808 may also be attached to the PCB 1810 to power the CPU, the RF dies, and other various device components.

Figure 6A:
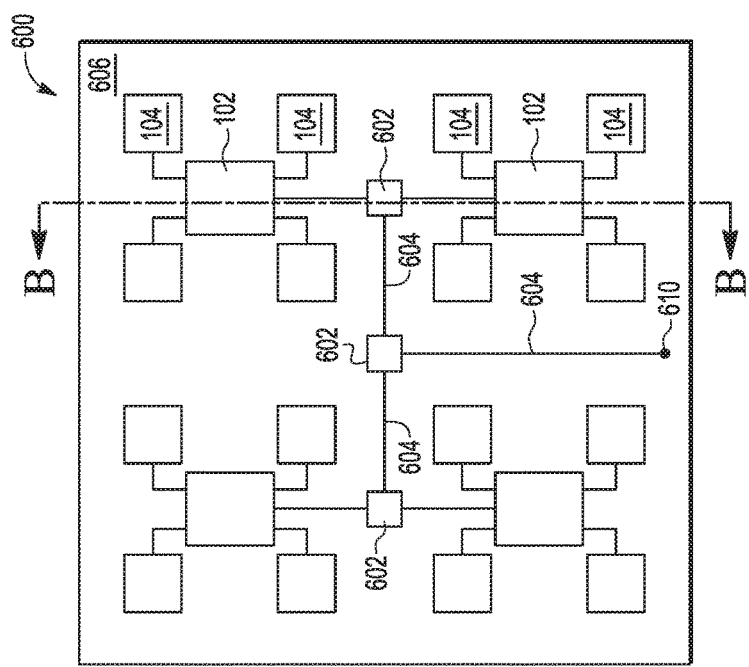
FIGS. 5, 6A, and 6B are block diagrams depicting an example array of RF cells according to some embodiments of the present disclosure.

FIG. 6A shows an example array 600 of RF dies 102 arranged in a two row, two column (2×2) array according to the RF cell layout 500 shown in FIG. 5. A branching RF signal path is coupled to each of the RF dies 102 using a number of splitter dies 602 and signal lines 604. Each splitter die 602 includes active circuitry that implements a dedicated power splitter, power combiner, or both having low insertion loss. Each splitter die 602 has 3 ports, one port "facing" a master port 610 and two ports "facing" the RF dies 102. A splitter die 602 that implements a dedicated power splitter is configured to split an input RF signal from the master port 610 into comparable output RF signals at the two ports facing a pair of RF dies 102. A splitter die 602 that implements a dedicated power combiner is configured to combine two input RF signals from the ports facing the RF dies 102 into a single RF signal that is output toward the master port 610. Splitter dies 602 may be formed using WLCSP (wafer level chip scale package) technology. The number of splitter dies 602 implemented between RF dies 102 depends on the number of branching points in the RF signal path, which may be comparable to the number of RF dies 102 implemented in the layout (e.g., 3 splitter dies implemented for the RF signal path to reach 4 RF dies). The RF signal path, including the splitter dies 602, are arranged along the boundaries of the RF cells 100 in order to minimize the distance (or minimize the length of signal lines 604) between each of the RF dies 102 and the splitter dies 602.

For example, when transmitting an RF signal (such as in a dedicated transmitter or in a transceiver set to a transmit mode), the RF signal starts from master port 610 on a "trunk" path and enters a first splitter die 602 shown in the middle of FIG. 6A, which outputs the RF signal onto a pair of branches (implemented by signal lines 604), one to the left and one to the right. The left branch is split into another pair of branches by another splitter die 602 (shown to the left of FIG. 6A), which are respectively provided to a top left RF die and a bottom left RF die that transmit the RF signal on their respective sets of antennas 104. The right branch is also split into another pair of branches (or signal lines 604) by another splitter die 602 (shown to the right of FIG. 6A), which are respectively provided to a top right RF die and a bottom right RF die that also transmit the RF signal on their respective sets of antennas 104. A reverse path is followed when receiving an RF signal (such as in a dedicated receiver or in a transceiver set to a receive mode). The RF signal is received at each set of antennas 104 and each pair of branches (or signal lines 604) are combined by respective splitter dies 602, eventually combining into the trunk path toward the master port 610. The branching pattern shown in FIG. 6A is symmetrical about the vertical and horizontal midlines of the array 600.

Figure 6B:
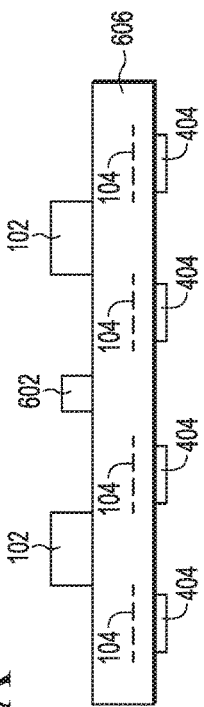

A cross-sectional view through line B is shown in FIG. 6B, which shows a pair of RF dies 102 and a splitter die 602 attached to a top surface of a PCB 606. The RF dies 102 are each coupled to a set of antennas 104 formed within PCB 606. In some embodiments, each antenna 104 is aligned with a reflector 404 on a bottom surface of PCB 606. In some embodiments, reflectors 404 are not implemented and the antennas 104 may instead be located on the bottom surface of PCB 606 in equivalent locations as reflectors 404.

Figure 8:
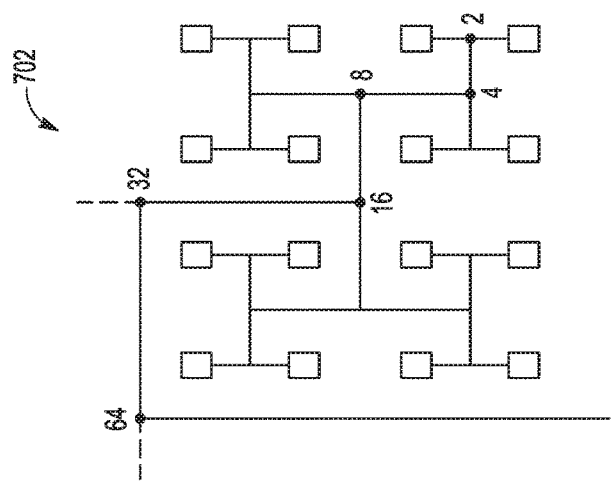
FIGS. 7 and 8 are block diagrams depicting another example array of RF cells according to some embodiments of the present disclosure.
Figure 7:
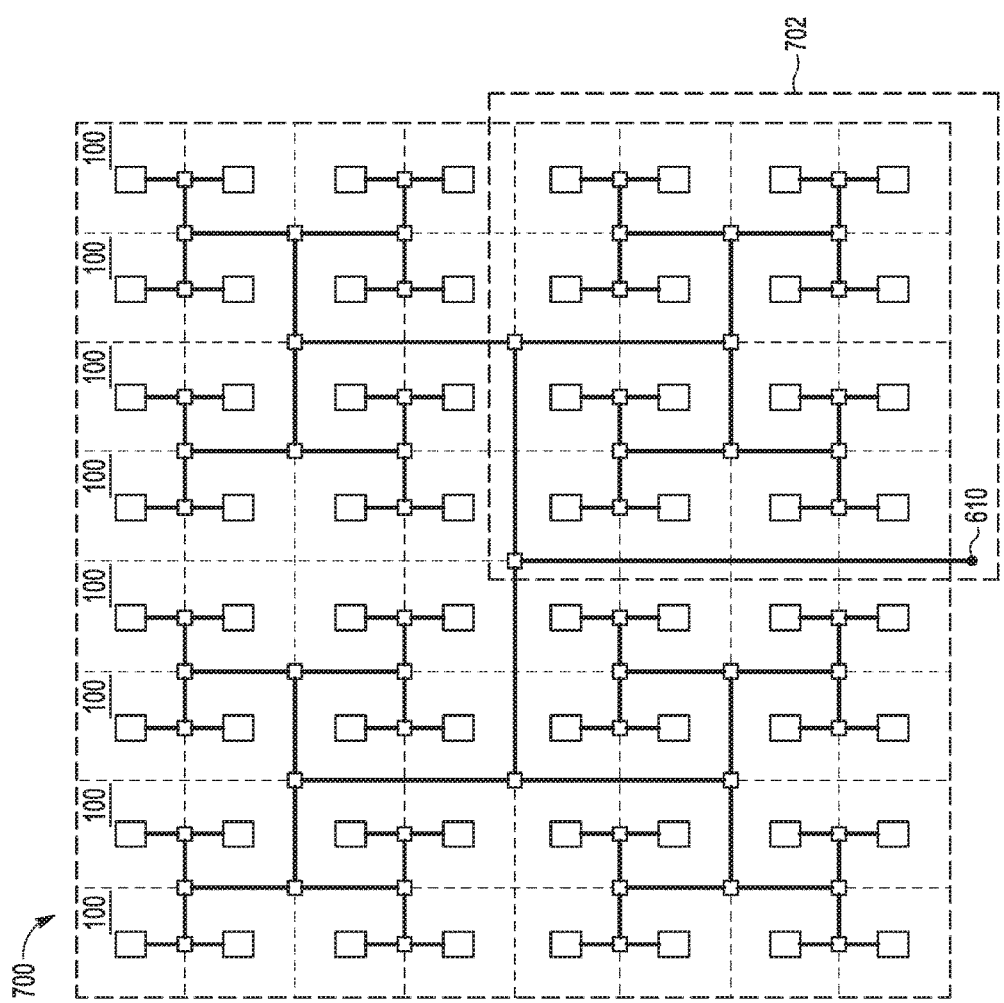

The example branching pattern shown in FIG. 6A can be used to form larger branching signal paths between the master port 610 and each of the RF dies 102 in a larger array. FIG. 7 shows an example branching signal path for an RF cell layout 700 that implements an 8×8 RF cell array, for a total of 64 RF dies and 63 splitter dies. The branching pattern of FIG. 6A is used to implement symmetrical portions of branches, where the overall resulting branching signal path is generally symmetrical about the vertical and horizontal midlines of the array 700 (e.g., a common branching pattern can be seen in four quadrants of the array 700). A lower right portion 702 is shown in FIG. 8, which shows a number of die that are coupled to each branching point. Starting at the pair of dies at the lower right in FIG. 8, a first branching point is coupled to 2 dies, a next branching point toward the master port 610 is coupled to 4 dies, and a next branching point toward the master port 610 is coupled to 8 dies. Subsequent branching points are coupled to 16, 32, and 64 dies, respectively.

The signal lines 604 that implement the branching signal path may be implemented either in the PCB 606 or in the various embodiments of packaged semiconductor devices discussed herein. Some embodiments provide that the signal lines 604 between each of the splitter dies 602 are implemented in the PCB 606, such as the embodiments shown in FIGS. 10 and 12. Other embodiments provide that the signal lines 604 between each of the splitter dies 602 are implemented in the packaged semiconductor device, such as the embodiments shown in FIGS. 16 and 17. The embodiments described herein may be fabricated using processes like those shown in FIGS. 9A-9I and 11A-11I.

FIG. 9A-9I shows an example process flow for creating a packaged semiconductor device that includes an array of both RF dies 102 and splitter dies 602, which are arranged according to a layout of RF cells 100. While only two RF dies 102 and one splitter die 602 are shown in FIG. 9A-9I, these die are representative of all RF dies 102 and splitter dies 602 included in the packaged semiconductor device.

FIG. 9A shows a number of RF dies 102 and a number of splitter dies 602 placed on a sacrificial carrier 902 according to an RF cell array. In some embodiments, the sacrificial carrier 902 is a glass carrier. The sacrificial carrier 902 includes a number of conductive traces and contacts 906 that are arranged in a layout that mimics the layout of a PCB to which the resulting packaged semiconductor device is attached. The RF dies 102 and splitter dies 602 are placed in locations on the sacrificial carrier 902 that correspond to locations on the PCB. The conductive traces and contacts 906 also implement testing circuitry 908 for each of the RF dies 102 and splitter dies 602. The RF dies 102 and the splitter dies 602 each have an active side 204 that include bond pads having attached solder bumps 904 (e.g., the die may be "bumped" in a WLCSP process). The RF dies 102 and splitter dies 602 are placed in active side 204 down (or face down) orientation on the sacrificial carrier 902, with solder bumps 904 aligned to contacts 906. RF dies 102 each have an RF-sensitive area 208 on the active side 204, which may include front-end circuitry that implements a transmitter, a receiver, or a transceiver. The RF dies 102 and splitter dies 602 each have a back side 202 that faces away from the sacrificial carrier 902.

FIG. 9B shows the RF dies 102 and splitter dies 602 attached to the sacrificial carrier 902 after reflow is performed, which forms electrical contact between the solder bumps 904 and the contacts 906. The reflow reduces any variation in the height of the solder bumps 904. FIG. 9C shows a probe test 910 being performed using testing circuitry 908 on the sacrificial carrier 902. Each of the RF dies 102 and splitter dies 602 are checked, and any detected faulty RF dies or splitter dies are removed and replaced. This step ensures a satisfactory yield in the resulting packaged semiconductor device, since one failed RF die 102 means a set of antennas (such as 4 or more) are unusable.

FIG. 9D shows a resulting panel of embedded dies after the RF dies 102 and splitter dies 602 are encapsulated on the sacrificial carrier 902, which occurs after any faulty die detected during probe test 910 are replaced. The RF dies 102 and splitter dies 602 are encapsulated with a mold compound material to form a mold body 912 having a back surface 916 over the back sides 202 of each of the dies 102 and 602 (where the encapsulated dies 102 and 602 are also referred to herein as an array of embedded dies). In some embodiments, an underfill material 914 is also used to fill the space between each die and the sacrificial carrier 902, resulting in mold body 912 fully encapsulating the dies 102 and 602. Underfill material 914 is a dielectric or insulating material with low CTE (coefficient of thermal expansion) that adheres to the dies 102 and 602. Underfill material (like underfill material 914) may include but is not limited to epoxy-based system or a low-CTE filler material (e.g., silica, alumina, boron nitride, and the like) in a liquid polymer that can be cured (e.g., by heat, ultraviolet light, and the like) into a solid composite material. In some embodiments, the underfill material may be mold compound material (used to form a mold body like mold body 912), which may be based on a biphenyl type or multi-aromatic type epoxy resin or other appropriate material that adheres to the dies 102 and 602. The encapsulation may be performed by transfer molding techniques, underfill techniques, overmolding techniques, glob top, compression molding techniques, or other suitable encapsulation techniques.

It is also noted that the pitch between the RF dies (such as the column pitch and row pitch) are adjusted to offset any known shrinkage of the mold body to maintain the proper distance between the RF dies. For example, a panel of a certain size may experience shrinkage of the mold body (e.g., as the mold compound sets, the overall mold body may shrink). The column and row pitches of the RF dies may be increased by the known shrinkage of the mold body to compensate for such shrinkage (e.g., if the mold body shrinks by 1 to 2%, then the distance between the RF dies is increased by 1 to 2%).

FIG. 9E shows the panel of embedded dies after a planarization step 918 is performed to reduce the thickness of the panel and form a new back side of the panel. The planarization step 918 removes a portion 920 of the mold body 912 to expose a (new) back surface 924 of the mold body 912, which is also referred to as a back surface 924 of the panel of embedded dies. The planarization step 918 also removes a portion of each of the dies 102 and 602 to expose a (new) back surface 922 of each die in the back surface 924 of the panel. The planarization step 918 may also be followed by a polishing step, such as using dry polish, ultra fine grinding, or other suitable technique. The planarization step 918 may be performed using a grinding or CMP (chemical mechanical polishing) technique to achieve coplanar surfaces 924 and 922.

FIG. 9F shows the panel of embedded dies after an optional back side metallization layer 926 is formed over coplanar surfaces 924 and 922. Without the metallization layer 926, the planarization step 918 reduces the thickness of dies 102 and 602 and provides coplanar back sides of the dies 102 and 602 (e.g., eliminates any tilting of the back sides of dies 102 and 602), both of which improve thermal performance of the panel of embedded dies. In the embodiment shown, the metallization layer 926 directly contacts the silicon back side of each of the RF dies 102 and splitter dies 602 for improved thermal conductivity and further improved thermal performance of the panel. A metallization layer (like metallization layer 926) is formed by a deposition process including but not limited to sputtering, spin coating, chemical vapor deposition (CVD), physical vapor deposition (PVD), and conformal depositing. A metallization layer (like metallization layer 926) may include one or more conductive materials, such as gold, copper, aluminum, tungsten, and the like, having suitable thermal conductive properties.

FIG. 9G shows the panel of embedded dies after a tape 928 is attached to the back side metallization layer 926 and the sacrificial carrier 902 is removed. In some embodiments, a tape (like tape 928) is formed from a polymer film such as PVC (polyvinyl chloride), polyolefin, polyethylene, or similar material, where an adhesive is placed on a surface of the polymer film. In some embodiments, a tape is removable in response to UV (ultraviolet light) exposure or temperature excursion (e.g., the adhesive weakens in response to the UV exposure or temperature excursion). In some embodiments, a tape includes a release layer to release the panel from the tape. In some embodiments, a temporary carrier (e.g., a glass carrier) 918 is used instead of the tape 928. In some embodiments, the sacrificial carrier 902 is removed by a grinding step 934 that exposes front surface 930 of the mold body 912, which is also referred to as a front surface 930 of the panel. Front surfaces 932 of each (reflowed) solder bump 904 are also exposed in the front surface 930 of the panel, where front surfaces 930 and 932 are coplanar. The front surfaces 932 of the solder bumps 904 are configured to be attached to a PCB. The panel 950 shown in FIG. 9G (after tape 928 is removed) may be one embodiment of the packaged semiconductor device.

FIG. 9H shows the panel of embedded dies after another planarization step 936 is performed to further thin the panel to a desired thickness and form a new front side of the panel. Planarization step 936 removes a portion of the mold body 912 to expose a (new) front surface 940 of the mold body 912, which is also referred to as a front surface 940 of the panel. The planarization step 918 also removes a portion of each solder bump 904 to expose a (new) front surface 942 of each solder bump 904 in the front surface 940 of the panel, which are configured to be attached to a PCB. The planarization step 936 may be performed using a grinding or CMP (chemical mechanical polishing) technique to achieve coplanar surfaces 940 and 942. The planarization step 936 may also be followed by a polishing step, such as using dry polish, ultra fine grinding, or other suitable technique. The panel 952 shown in FIG. 9H (after tape 928 is removed) may be one embodiment of the packaged semiconductor device.

FIG. 9I shows the panel of embedded dies after a laser step 938 is performed and the tape 928 is removed. The presence of a dielectric material like mold body 912 around the RF-sensitive areas 208 contributes to signal degradation and negatively impacts RF performance. Laser step 938 uses a laser to remove a portion of the mold body 912 from around RF-sensitive areas 208, which exposes the active side 204 of the RF dies 102 without damaging the RF dies 102. In some embodiments, the underfill material 914 used to underfill the RF-sensitive area 208 between each of the RF dies 102 and the sacrificial carrier 902 should be selected as a material that is easily removable by a laser. A laser step (like laser step 938) may be implemented using a near infrared (NIR) laser (e.g., Nd:YAG laser) or a green (e.g., second harmonic generation) laser, or other suitable lasers such as those used in laser marking or solder ball decapping to remove dielectric material (like underfill material and mold compound material) locally without damaging the underlying feature. The laser step (like step 938) effectively forms an air gap around the RF-sensitive areas 208, which is beneficial for RF performance. The panel 954 shown in FIG. 9I (after laser step 938) may be one embodiment of the packaged semiconductor device.

Figure 10:
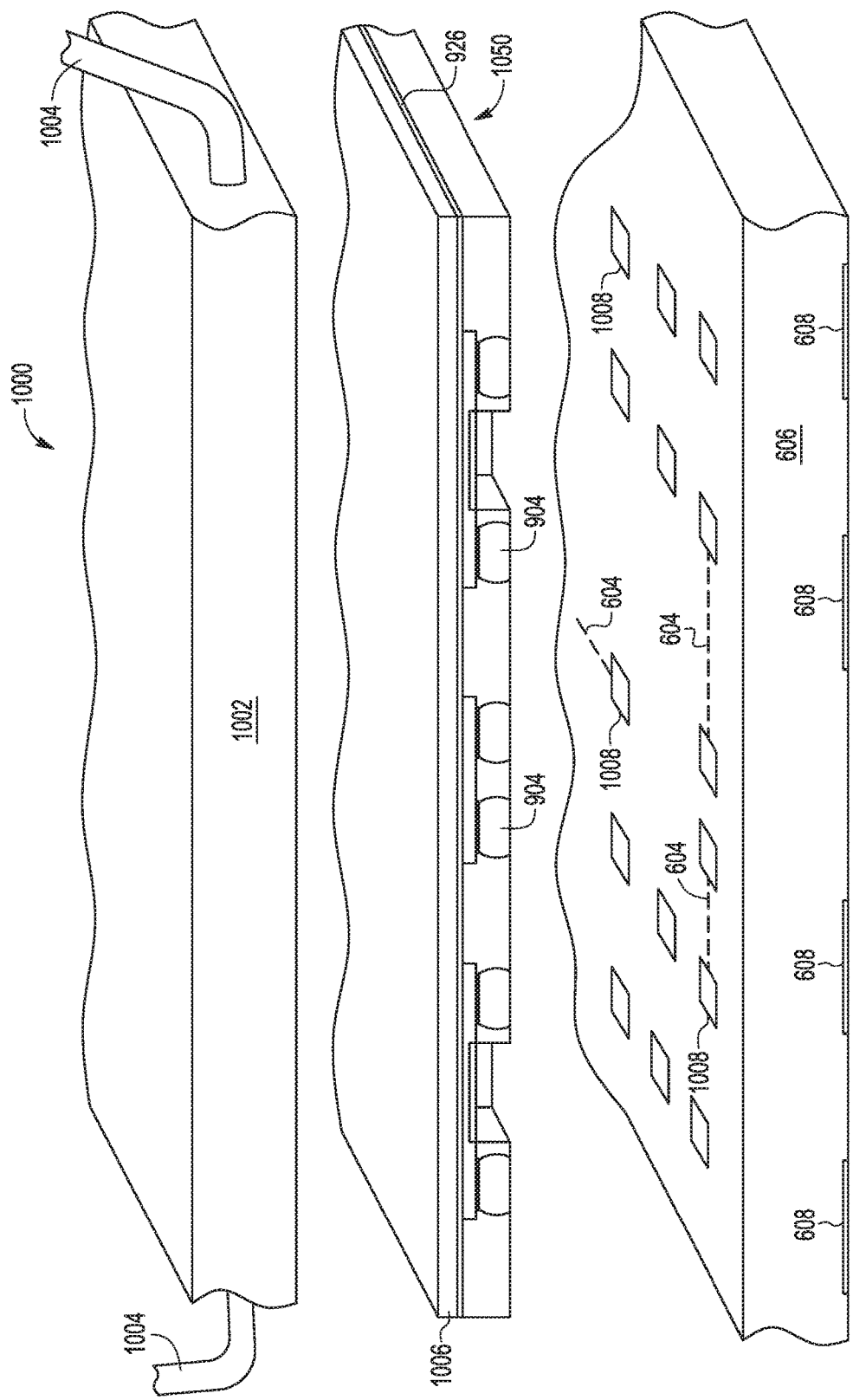
FIG. 10 is a block diagram depicting an interface between an example packaged semiconductor device and a printed circuit board (PCB) including an array of antennas, according to some embodiments of the present disclosure.

FIG. 10 shows an exploded view of an example device 1000 that includes an example packaged semiconductor device 1050 fabricated using a fabrication process like shown in FIG. 9A-9I (e.g., devices 950, 952, or 954). As shown, a thermal interface material (TIM) 1006 is attached to the back side of the packaged semiconductor device 1050, which is formed by metallization layer 926. TIM 1006 is heat conductive. TIM 1006 is also attached to a cooling system 1002, which in the embodiment shown includes one or more heat pipes 1004. In some embodiments, cooling system 1002 also includes a heat sink or heat spreader around the one or more heat pipes 1104, which may be formed of aluminum, aluminum alloys, copper, copper alloys, boron nitride, aluminum nitride, diamond, carbon nanotubes, and combinations thereof. Since the back surfaces of the RF dies 102 and splitter dies 602 are ensured to be co-planar (due to the planarization step 918), an efficient thermal conductivity path is formed between a planar surface of the cooling system 1002 (e.g., the heat sink or spreader) and each back surface of the dies 102 and 602 via the metallization layer 926 and the TIM 1006, providing improved thermal transfer. Further, since the RF dies 102 and splitter dies 602 are thinned, the thermal conductivity path reaches closer to the active circuitry generating the heat for improved thermal transfer. Examples of TIM include, but are not limited to, silicone or epoxy-based materials containing suspended carbon nanotubes, or beryllium oxide, aluminum nitride, boron nitride, or diamond powders. In some embodiments, metallic fillers like silver can also be used. In some embodiments, TIM can be a phase-change metal alloy, a graphene-based adhesive, and the like.

It is noted that a heat pipe 1004 system is a highly effective thermal conductor designed for long-term operation with practically no maintenance, as compared with a forced ventilator or fan system that includes motors subject to break down when continuously run for long-term operation. A forced ventilator or fan system may also require a heat sink or heat spreader, which may lack an efficient thermal conductivity path to each and every die, depending on whether the (possibly non-planar die) make sufficient thermal contact with a planar surface of the heat sink (e.g., the die may be non-planar due to some degree of tilt).

An interface between packaged semiconductor device 1050 and PCB 606 is also shown in FIG. 10. Device 1050 implements an array of embedded dies (including both RF dies 102 and splitter dies 602) based on a layout that is also implemented by the PCB 606. The array of embedded dies in the device 1050 have a number of exposed solder bumps 904, which align with a number of landing pads 1008 on the PCB 606. In some embodiments, the solder bumps 904 may be attached to the landing pads 1008 using solder paste, solder balls, or other forms of solder attachment, in combination with a reflow process. The landing pads 1008 connected to the splitter dies 602 provide connections to signal lines 604 in the PCB 606. Some of the landing pads 1008 connected to the RF dies 102 provide connections to antennas in the PCB 606. In some embodiments, the antennas may be implemented as antennas 608 on a back side of PCB 606. In other embodiments, the array of antennas may be implemented as an array internal to PCB 606, where reflectors 608 are implemented on the back side of PCB 606.

Since signal lines 604 are implemented in the PCB 606, the RF signal is routed back and forth between the device 1050 and the PCB 606. For example, the RF signal is routed from a signal line 604 on the PCB 606, transitions to a splitter die 602 in the packaged semiconductor device 1050, transitions back to a subsequent signal line 604 on the PCB 606, and (ultimately) transitions to an RF die 102 in the packaged semiconductor device 1050, where signal degradation occurs at each transition. When solder bumps are used to attach the device 1050 to the PCB 606, further signal degradation also occurs at each solder bump transition. Other embodiments that minimize the back-and-forth nature of this RF signal routing are further discussed below in connection with FIGS. 16 and 17, which may minimize signal loss by reducing the number of transitions between the PCB 606 and the device 1050.

FIG. 11A-11I shows another example process flow for creating a packaged semiconductor device that includes an array of both RF dies 102 and splitter dies 602, which are arranged according to a layout of RF cells 100. The dies 102 and 602 shown in FIG. 11A-11I are representative of all dies 102 and 602 included in the packaged semiconductor device. The process shown in FIG. 11A-11I implements fan out wafer level processing (FOWLP) using redistribution layers (RDL).

FIG. 11A shows a number of RF dies 102 and a number of splitter dies 602 placed on a temporary carrier 1102 according to an RF cell array. In some embodiments, the temporary carrier 1102 is a sacrificial carrier like sacrificial carrier 902 (discussed above). In some embodiments, the temporary carrier 1102 is a glass carrier. The dies 102 and 602 each have an active side 204 that include bond pads, but the bond pads are not bumped at this time. The dies 102 and 602 are placed in active side 204 down (or face down) orientation on the temporary carrier 1102 in locations that correspond to locations on the PCB. RF dies 102 each have an RF-sensitive area 208 on the active side 204, which may include front-end circuitry that implements a transmitter, a receiver, or a transceiver. The RF dies 102 and splitter dies 602 each have a back side 202 that faces away from the temporary carrier 1102.

FIG. 11B shows a resulting panel of embedded dies after the RF dies 102 and splitter dies 602 are encapsulated on the temporary carrier 1102. The dies 102 and 602 are encapsulated with a mold compound material to form a mold body 1106 having a back surface 1108 over the back sides 202 of each of the dies 102 and 602 (where the encapsulated dies 102 and 602 are also referred to herein as an array of embedded dies). FIG. 11C shows the resulting panel of embedded dies after the temporary carrier 1102 is removed, which exposes a front surface 1110 of the mold body 1106, also referred to as a front surface 1110 of the panel. The active side 204 is also exposed in the front surface 1110 of the panel. In some embodiments, the temporary carrier 1102 may be removed by a grinding step like that shown in FIG. 9G. In other embodiments, the temporary carrier 1102 includes a release layer to release the panel from the temporary carrier 1102.

FIG. 11D shows the panel of embedded dies after an RDL (redistribution layer) structure 1112 is formed on the front surface 1110 of the panel. An RDL structure (like structure 1112) is formed from a number of dielectric and metal layers that in turn form a number of conductive traces extending through the RDL structure. An RDL structure is formed using a sequence of numerous process steps applied to the flag, including but not limited to depositing semiconductor materials including dielectric materials and metals, such as growing, oxidizing, sputtering, and conformal depositing, etching semiconductor materials, such as using a wet etchant or a dry etchant, performing photolithography for patterning, including depositing and removing photolithography masks or other photoresist materials, laminating, dispensing, printing, jetting, spraying, and the like. In the embodiment shown, RDL structure 1112 implements conductive traces 1116 and contacts 1114 that contact each bond pad on each of the dies 102 and 602.

Figure 11E:
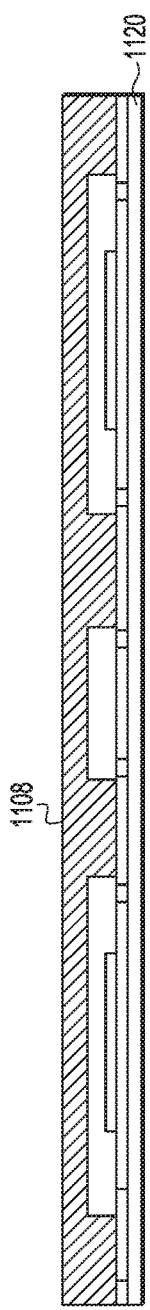
Figure 11F:
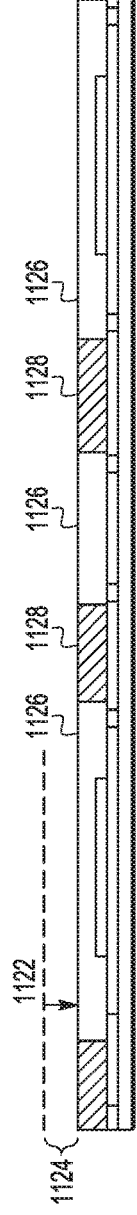

FIG. 11E shows the panel of embedded dies after a tape 1120 (like tape 928) is attached to the RDL structure 1112. FIG. 11F shows the panel of embedded dies after a planarization step 1122 is performed to reduce the thickness of the panel and form a new back side of the panel. The planarization step 1122 removes a portion 1124 of the mold body 1106 to expose a (new) back surface 1128 of the mold body 1106, which is also referred to as a back surface 1128 of the panel. The planarization step 1122 also removes a portion of each of the dies 102 and 602 to expose a (new) back surface 1126 of each die in the back surface 1128 of the panel. The planarization step 1122 may be performed using a grinding or CMP technique to achieve coplanar surfaces 1126 and 1128. The planarization step 1122 may also be followed by a polishing step, such as dry polish, ultra fine grinding, or other suitable technique.

Figure 11G:
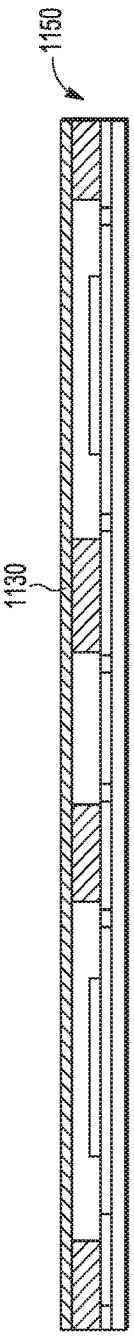

FIG. 11G shows the panel of embedded dies after an optional back side metallization layer 1130 (like metallization layer 926) is formed over coplanar surfaces 1126 and 1128. The metallization layer 1130 directly contacts the back side of each of the RF dies 102 and splitter dies 602 for improved thermal conductivity. The panel 1150 shown in FIG. 11G (after tape 1120 is removed) may be one embodiment of the packaged semiconductor device.

Figure 11H:
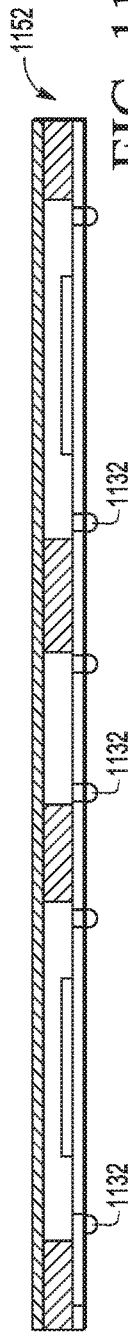

FIG. 11H shows the panel of embedded dies after tape 1120 is removed and the panel is bumped, with solder bumps 1132 formed on each contact 1114 of the RDL structure 1112. The panel 1152 shown in FIG. 11H may be one embodiment of the packaged semiconductor device.

Figure 11I:
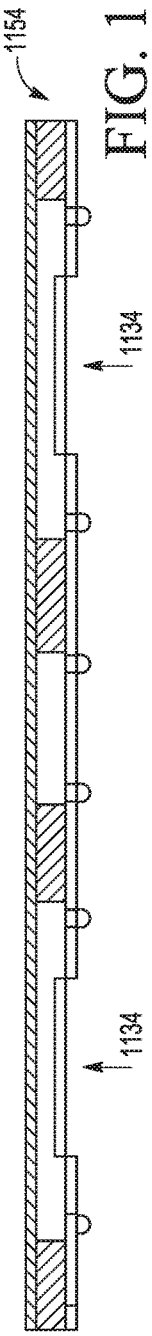

FIG. 11I shows the panel of embedded dies after a laser step 1134 is performed. Laser step 1134 (like step 938) uses a laser to remove a portion of the RDL structure 1112 from around RF-sensitive areas 208, which exposes the active side 204 of the RF dies 102 without damaging the RF dies 102. The laser step forms an air gap around the RF-sensitive areas 208, which is beneficial for RF performance. The panel 1154 shown in FIG. 11I may be one embodiment of the packaged semiconductor device.

Figure 12:
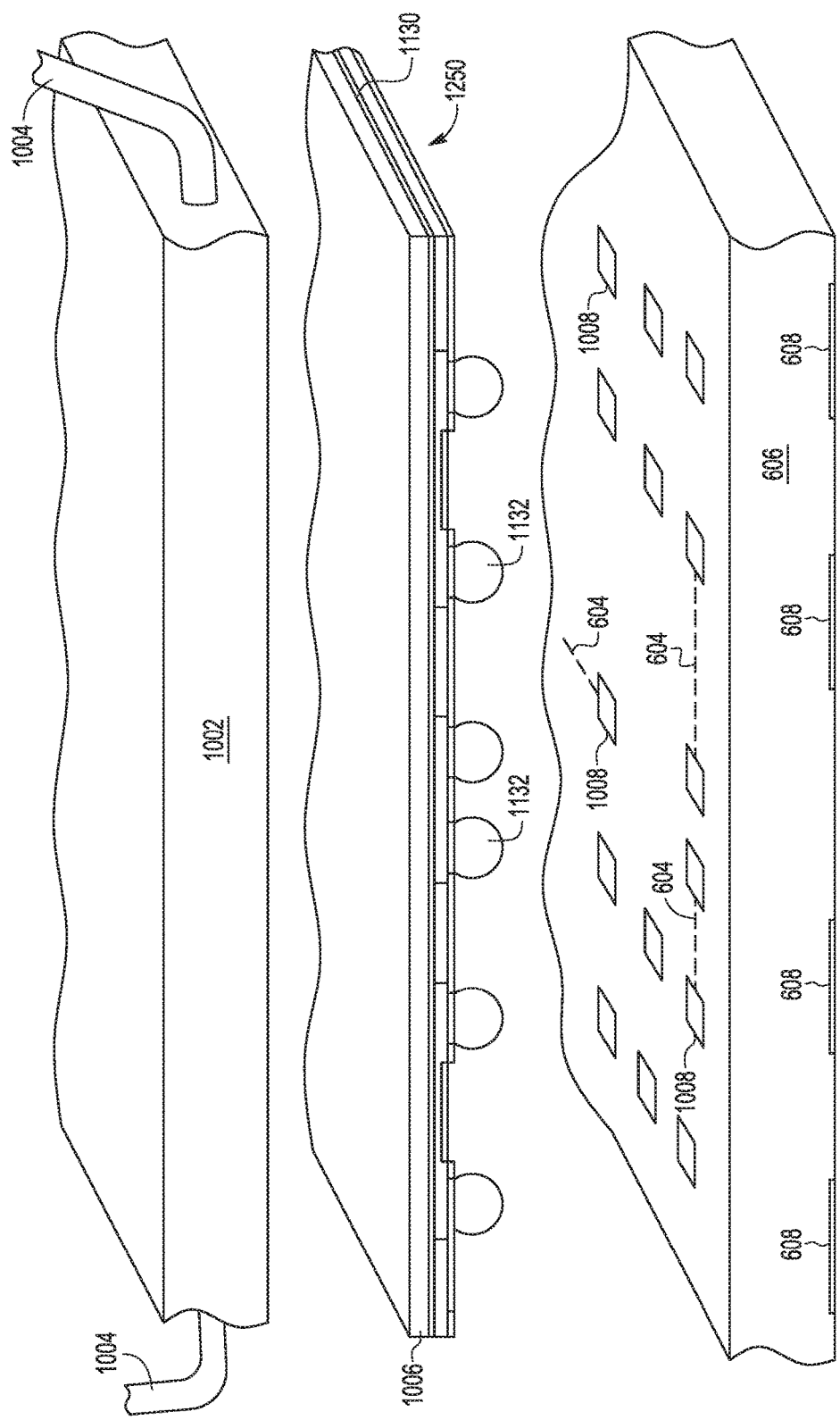
FIG. 12 is a block diagram depicting an interface between another example packaged semiconductor device and a printed circuit board (PCB) including an array of antennas, according to some embodiments of the present disclosure.

FIG. 12 shows an exploded view of another example device that includes an example packaged semiconductor device 1250 fabricated using a fabrication process like that shown in FIG. 11A-11I (e.g., devices 1150, 1152, or 1154). TIM 1006 is attached to the back side of the packaged semiconductor device 1250, which is formed by metallization layer 1130. TIM 1006 is also attached to a cooling system 1102, as described above. An interface between packaged semiconductor device 1250 and PCB 606 is also shown. The solder bumps 1132 on the device 1050 align with a number of landing pads 1008 on the PCB 606, which includes connections to antennas in the PCB, as described above. The solder bumps 1132 may be connected to the PCB 606 by performing a reflow process. The signal lines 604 are also implemented in the PCB 606 in the embodiment shown.

Figure 13:
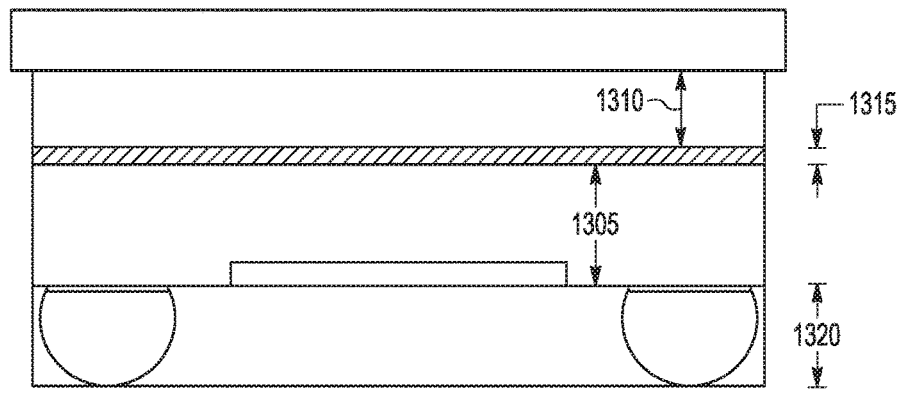
FIGS. 13, 14, and 15 are block diagrams depicting close-up views of example packaged semiconductor devices, according to some embodiments of the present disclosure.
Figure 14:
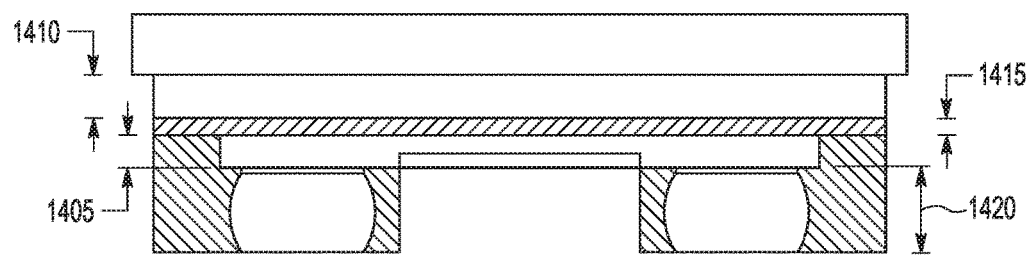
Figure 15:
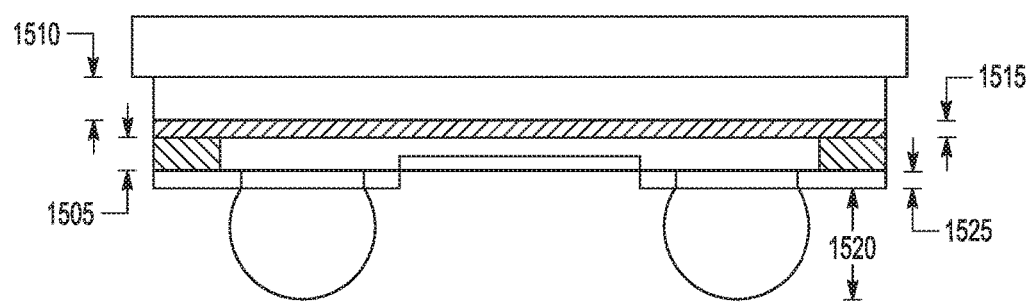

FIGS. 13, 14, and 15 show representative cross-sectional views for comparison of thicknesses or heights achieved by the fabrication processes like those shown in FIGS. 9A-9I and 11A-11I. For reference, FIG. 13 shows a conventional packaged semiconductor device that implements bare RF dies each having a thickness 1305, a TIM thickness 1310, a metallization thickness 1315, and a solder bump height 1320 (e.g., before reflow). The TIM and metallization layers are used to form a thermal connectivity path from the bare RF die to the thermal transfer mechanism at the top of the device shown in FIG. 13. Conventionally, the bare RF dies are individually placed on a PCB, where each bare RF die may have some tilt or rotation, where the back sides of the bare RF dies are non-planar. To compensate for this degree of non-planarity, the TIM thickness 1310 in the conventional device is larger than needed (e.g., 100 microns) to attach each non-planar RF die to the planar surface of the thermal transfer mechanism. However, the larger TIM thickness 1310 increases the length of the thermal conductivity path and reduces thermal performance of the device in FIG. 13. Further, the thickness 1305 of the bare RF dies may be the original thickness of the die when singulated from a wafer (e.g., 200 microns). The resulting profile height of the device in FIG. 13 is the sum of the thicknesses 1305, 1310, 1315, and 1320.

FIG. 14 shows an example packaged semiconductor device formed by a fabrication process like that shown in FIG. 9A-9I, and FIG. 15 shows an example packaged semiconductor device formed by a fabrication process like that shown in FIG. 11A-11I. FIGS. 14 and 15 both show a reduced thickness 1405 and 1505 of the RF dies, due to the planarization steps in the presently disclosed fabrication processes, which removes extraneous silicon from the back side of the RF dies (e.g., thins the RF die by 20 to 50 microns) and reduces the profile height. Since the mold body implements sufficient rigidity in FIG. 14, the die thickness 1405 may be reduced to a greater amount than die thickness 1504 (e.g., thickness 1405 may be a total of 50 microns, while thickness 1505 may be a total of 150 microns). Since the planarization steps ensure a coplanar back side of the RF dies, a thinner TIM thickness 1410 and 1510 is required (e.g., 25 to 50 microns), which also reduces the profile height. Further, even if a same metallization thickness is implemented (e.g., thicknesses 1415 and 1515 are the same value as thickness 1315, such as 2 to 6 microns), the thermal conductivity path from the RF dies to the thermal transfer mechanism (e.g., heat pipe) is both shorter and reaches closer to the active circuitry on the active side of the RF dies (due to the thinned silicon) to provide improved thermal transfer.

FIG. 14 also shows a solder bump height 1420 that is shorter than the solder bump height 1320 (e.g., before reflow), where the solder bump height 1420 for every solder bump on the device can be controlled by a planarization step. FIG. 15 shows a solder bump height 1520 (before reflow), which may be equal to the solder bump height 1320 (e.g., 170 to 200 microns). FIG. 15 also shows an RDL structure height 1525 that offsets the solder bump height 1520 (e.g., depending on the RDL layer thickness and number of RDL layers used, such as a total of 10 to 30 microns). However, the resulting profile height of the devices shown in FIGS. 14 and 15 are still shorter than the profile height of the conventional device shown in FIG. 13.

It is noted that the process shown in FIG. 11A-11I can be modified to implement fan out wafer level processing (FOWLP) using redistribution layers (RDL) to move the signal lines 604 to the packaged semiconductor device (and out of the PCB), which reduces the number of transitions between the resulting packaged semiconductor device and the PCB. For example, the formation of the RDL structure shown in FIG. 11D can be modified to form an RDL structure that includes the signal lines 604 formed among splitter dies 602 and RF dies 102.

Figure 16:
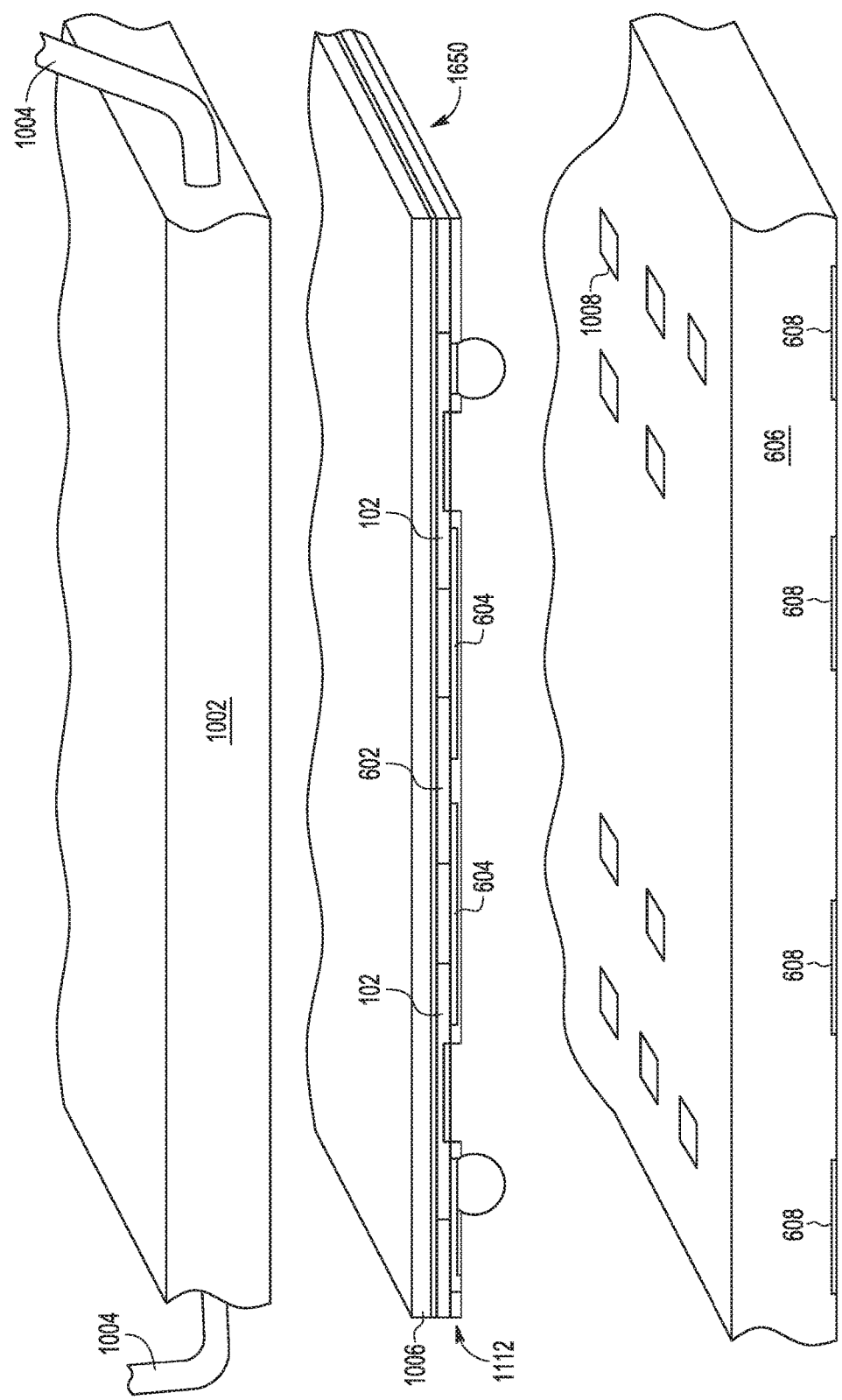
FIGS. 16 and 17 are block diagrams depicting interfaces between additional examples of packaged semiconductor devices and a printed circuit board (PCB) including an array of antennas, according to some embodiments of the present disclosure.

FIG. 16 shows an exploded view of another example device that includes an example packaged semiconductor device 1650 fabricated using a fabrication process like that shown in FIG. 11A-11I, including the modified FIG. 11D RDL step. Device 1650 includes an RDL structure 1112 that forms the branching RF signal path (e.g., like the path shown in FIG. 7), where the conductive traces 1116 of the RDL structure 1112 also form signal lines 604 between bond pads on the RF dies 102 to bond pads on the splitter dies 602. The RDL structure 1112 may also form other lines (e.g., ground lines) to the bond pads on the splitter dies 602, where the splitter dies 602 no longer need to be bumped at all. The bond pads on the RF dies 102 that are connected to the splitter dies 602 by signal lines 104 also do not need to be bumped. Such an embodiment also allows signal lines 604 and corresponding landing pads 1008 to be removed from the PCB 606 (e.g., simplifying the PCB fabrication process). The embodiment shown in FIG. 16 minimizes the transitions from the PCB 606 to the device 1650 (e.g., reduces the transitions to one, where the RF signal is provided to a master port 610 on the device 1650), which reduces signal degradation and improves RF performance.

Figure 17:
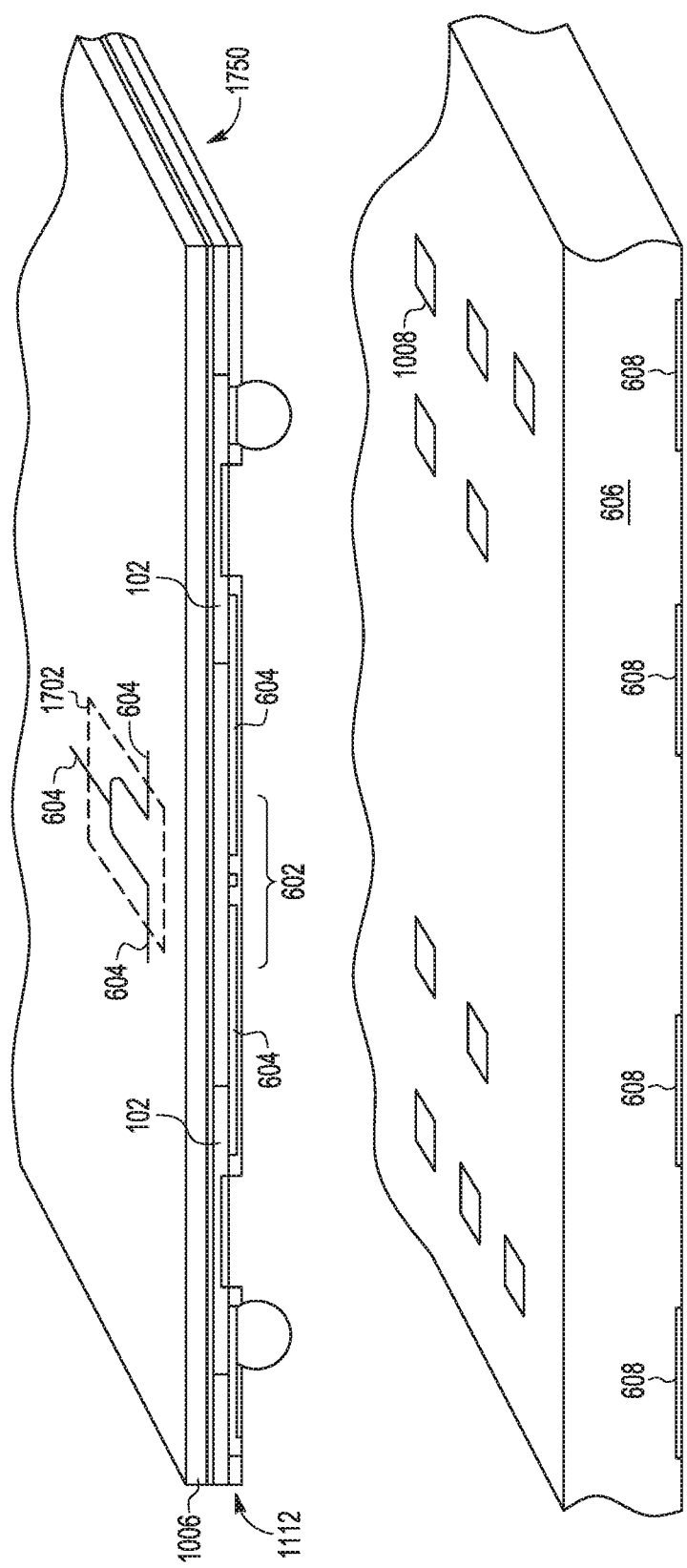

FIG. 17 shows an exploded view of another example device that includes an example packaged semiconductor device 1750 fabricated using a fabrication process like that shown in FIG. 11A-11I, including the modified FIG. 11D RDL step. Device 1750 includes an RDL structure 1112 that further implements the functionality of each splitter die 602. Such an embodiment omits placing the splitter dies 602 as individual dies on the temporary carrier 1102 in the step shown in FIG. 11A. Instead, active circuitry 1702 (shown in dashed outline) is formed within the RDL structure 1112 on device 1750 (such as during the modified FIG. 11D RDL step), which implements the power splitter, power combiner, or both. The RDL structure 1112 also forms the branching RF signal path (e.g., like the path shown in FIG. 7), where the conductive traces of the RDL structure 1112 also form signal lines 604 between bond pads on the RF dies 102 to respective ports of the active circuitry 1702. The bond pads on the RF dies 102 that are connected to the active circuitry 1702 by signal lines 104 do not need to be bumped. Such an embodiment also allows signal lines 604 and corresponding landing pads 1008 to be removed from the PCB 606 (e.g., simplifying the PCB fabrication process). The embodiment shown in FIG. 17 minimizes the transitions from the PCB 606 to the device 1750 (e.g., reduces the transitions to one, where the RF signal is provided to a master port 610 on the device 1750), which reduces signal degradation and improves RF performance.

The RF dies 102 described herein may be formed from a semiconductor wafer (also referred to as simply wafer), which can be any semiconductor material or combinations of materials, such as gallium arsenide, silicon germanium, silicon-on-insulator (SOI), silicon, monocrystalline silicon, the like, and combinations of the above. The RF dies 102 may be formed using a flip chip process to bump the dies 102 and singulate the dies 102 from the wafer. The splitter dies 602 described herein may also be formed from a semiconductor wafer, which may use a WLCSP (wafer level chip scale package) process to bump the dies 602 and singulate the dies 602 from the wafer. The active circuitry for the RF dies 102 and the splitter dies 602 is formed using a sequence of numerous process steps applied to the wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. In some embodiments, the active circuitry may be a combination of integrated circuit components or may be another type of microelectronic device. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

By now it should be appreciated that there has been provided embodiments of packaged semiconductor devices and embodiments of fabricating such devices that may include a plurality of RF dies, a plurality of splitter dies, or both, where the total number of dies included in the presently disclosed device may be hundreds of dies. The device provides planar surfaces for attachment to a printed circuit board (PCB) or other carrier, and attachment to a cooling system for improved thermal performance. The device may also include conductive traces or signal lines that minimize any transitions between the PCB and the device for improved RF performance.

In one embodiment of the present disclosure, a method for fabricating a multi-die package is provided, which includes: placing a plurality of flip chip dies and a plurality of splitter dies on a sacrificial carrier, each flip chip die and each splitter die positioned in an active side down orientation on the sacrificial carrier; performing solder reflow to join solder bumps of each flip chip die and each splitter die to the sacrificial carrier, wherein the sacrificial carrier includes test probe circuitry; testing the plurality of flip chip dies and the plurality of splitter dies in a probe test using the test probe circuitry; replacing any faulty flip chip dies and any faulty splitter dies as indicated by the testing; overmolding the plurality of flip chip dies and the plurality of splitter dies on the sacrificial carrier to form a panel of embedded dies; planarizing the panel of embedded dies to expose a back surface of each flip chip die and each splitter die in a back surface of the panel of embedded dies; forming a metallization layer across the back surface of the panel of embedded dies that contacts the back surface of each flip chip die and each splitter die; and removing the sacrificial carrier to expose a front surface of the panel of embedded dies, wherein a contact surface of each solder bump of each flip chip die and each splitter die is exposed in the front surface of the panel of embedded dies.

One aspect of the above embodiment provides that the removing the sacrificial carrier includes: grinding away the sacrificial carrier.

Another aspect of the above embodiment provides that the sacrificial carrier includes a glass carrier.

Another aspect of the above embodiment provides that the method further includes: attaching an adhesive tape to the metallization layer; after removing the sacrificial carrier, planarizing to expose a new front surface of the panel of embedded dies, wherein a new contact surface of each solder bump is exposed in the new front surface of the panel of embedded dies.

Another aspect of the above embodiment provides that the planarizing the panel of embedded dies includes: removing a back side portion from each flip chip die and from each splitter die to expose the back surface of each flip chip die and each splitter die.

Another aspect of the above embodiment provides that the overmolding further includes: underfilling a space between each flip chip die and the sacrificial carrier with underfill material.

A further aspect of the above embodiment provides that the method further includes: after removing the sacrificial carrier, performing laser removal on the front surface of the panel of embedded dies to remove the underfill material from a radio frequency (RF) sensitive area on each bumped side of each flip chip die.

Another aspect of the above embodiment provides that each flip chip die includes a radio frequency (RF) transceiver near a bumped side of each flip chip die.

Another aspect of the above embodiment provides that each splitter die is configured to receive a radio frequency (RF) signal at a first port and output the RF signal at a second port and a third port during a transmit mode, and is configured to combine RF signals on the second and third ports at the first port during a receive mode.

Another aspect of the above embodiment provides that the multi-die package is configured to be attached to a printed circuit board (PCB), wherein the PCB includes: a plurality of antennas, wherein each flip chip die of the multi-die package is configured to be connected to a subgroup of the plurality of antennas, and a plurality of radio frequency (RF) signal lines configured to provide signal connections between the plurality of flip chip dies and the plurality of splitter dies.

In another embodiment of the present disclosure, a method for fabricating a multi-die package is provided, which includes: attaching a plurality of flip chip dies to a temporary carrier by adhesive tape, each of the flip chip die positioned on the temporary carrier in an active side down orientation; overmolding the plurality of flip chip dies on the temporary carrier to form a panel of embedded dies; removing the temporary carrier and adhesive tape to expose a front surface of the panel of embedded dies, wherein an active side of each flip chip die is exposed after the temporary carrier and adhesive tape are removed; forming a redistribution layer (RDL) structure over the front surface of the panel of embedded dies, wherein the RDL structure includes traces connected to the active side of each flip chip die; planarizing the panel of embedded dies to expose a back surface of each flip chip die in a back surface of the panel of embedded dies; and forming a metallization layer across the back surface of the panel of embedded dies that contacts the back surface of each flip chip die.

One aspect of the above embodiment provides that the method further includes: placing a plurality of solder balls on contact pads in the RDL structure.

Another aspect of the above embodiment provides that the method further includes: performing laser removal on the RDL structure to remove a portion of the RDL structure from a radio frequency (RF) sensitive area on each bumped side of each flip chip die.

Another aspect of the above embodiment provides that the planarizing the panel of embedded dies includes: removing a back side portion from each flip chip die to expose the back surface of each flip chip die.

Another aspect of the above embodiment provides that the method further includes: placing a plurality of splitter dies between the plurality of flip chip dies on the temporary carrier in an active side down orientation, wherein the plurality of splitter dies is also included in the panel of embedded dies after the overmolding.

A further aspect of the above embodiment provides that the multi-die package is configured to be attached to a printed circuit board (PCB), wherein the PCB includes: a plurality of antennas, wherein each flip chip die of the multi-die package is configured to be connected to a subgroup of the plurality of antennas, and a plurality of radio frequency (RF) signal lines configured to provide signal connections between the plurality of flip chip dies and the plurality of splitter dies.

Another further aspect of the above embodiment provides that the RDL structure further includes: a plurality of radio frequency (RF) signal lines providing signal connections between the plurality of flip chip dies and the plurality of splitter dies.

A still further aspect of the above embodiment provides that the multi-die package is configured to be attached to a printed circuit board (PCB), wherein the PCB includes: a plurality of antennas, wherein each flip chip die of the panel of embedded dies is configured to be connected to a subgroup of the plurality of antennas.

Another aspect of the above embodiment provides that the RDL structure further includes: a plurality of splitter circuits between the plurality of flip chip dies; and a plurality of radio frequency (RF) signal lines providing signal connections between the plurality of flip chip dies and the plurality of splitter circuits.

Another aspect of the above embodiment provides that the method further includes: attaching a first side of thermal interface material (TIM) to the metallization layer of the panel of embedded dies, wherein a second side of the TIM is configured to be attached to a cooling system including a heat pipe.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is noted that the term "neighboring" as used herein means "adjacent to" (e.g., next to and without an intervening object), and "laterally" as used herein means "in a sideways direction" (e.g., a horizontal direction that is parallel to a plane of the substrate).

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value.

Although the invention is described herein with reference to specific embodiments, various modifications and changes can be made without departing from the scope of the present invention as set forth in the claims below. For example, additional or fewer RF die may be implemented in FIG. 7. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for fabricating a multi-die package, the method comprising:
placing a plurality of flip chip dies and a plurality of splitter dies on a sacrificial carrier, each flip chip die and each splitter die positioned in an active side down orientation on the sacrificial carrier;
performing solder reflow to join solder bumps of each flip chip die and each splitter die to the sacrificial carrier, wherein the sacrificial carrier comprises test probe circuitry;
testing the plurality of flip chip dies and the plurality of splitter dies in a probe test using the test probe circuitry;
replacing any faulty flip chip dies and any faulty splitter dies as indicated by the testing;

overmolding the plurality of flip chip dies and the plurality of splitter dies on the sacrificial carrier to form a panel of embedded dies;

planarizing the panel of embedded dies to expose a back surface of each flip chip die and each splitter die in a back surface of the panel of embedded dies;

forming a metallization layer across the back surface of the panel of embedded dies that contacts the back surface of each flip chip die and each splitter die; and removing the sacrificial carrier to expose a front surface of the panel of embedded dies, wherein a contact surface of each solder bump of each flip chip die and each splitter die is exposed in the front surface of the panel of embedded dies.

2. The method of claim 1, wherein the removing the sacrificial carrier comprises:

grinding away the sacrificial carrier.

3. The method of claim 1, wherein the sacrificial carrier comprises a glass carrier.

4. The method of claim 1, further comprising:

attaching an adhesive tape to the metallization layer;

after removing the sacrificial carrier, planarizing to expose a new front surface of the panel of embedded dies, wherein a new contact surface of each solder bump is exposed in the new front surface of the panel of embedded dies.

5. The method of claim 1, wherein the planarizing the panel of embedded dies comprises:

removing a back side portion from each flip chip die and from each splitter die to expose the back surface of each flip chip die and each splitter die.

6. The method of claim 1, wherein the overmolding further comprises:

underfilling a space between each flip chip die and the sacrificial carrier with underfill material.

7. The method of claim 6, further comprising:

after removing the sacrificial carrier, performing laser removal on the front surface of the panel of embedded dies to remove the underfill material from a radio frequency (RF) sensitive area on each bumped side of each flip chip die.

8. The method of claim 1, wherein each flip chip die comprises a radio frequency (RF) transceiver near a bumped side of each flip chip die.

9. The method of claim 1, wherein each splitter die is configured to receive a radio frequency (RF) signal at a first port and output the RF signal at a second port and a third port during a transmit mode, and is configured to combine RF signals on the second and third ports at the first port during a receive mode.

10. The method of claim 1, wherein the multi-die package is configured to be attached to a printed circuit board (PCB), wherein the PCB comprises:

a plurality of antennas, wherein each flip chip die of the multi-die package is configured to be connected to a subgroup of the plurality of antennas, and a plurality of radio frequency (RF) signal lines configured to provide signal connections between the plurality of flip chip dies and the plurality of splitter dies.

11. A method for fabricating a multi-die package, the method comprising:

attaching a plurality of flip chip dies to a temporary carrier by adhesive tape, each of the flip chip die positioned on the temporary carrier in an active side down orientation;

overmolding the plurality of flip chip dies on the temporary carrier to form a panel of embedded dies;

removing the temporary carrier and adhesive tape to expose a front surface of the panel of embedded dies, wherein an active side of each flip chip die is exposed after the temporary carrier and adhesive tape are removed;

forming a redistribution layer (RDL) structure over the front surface of the panel of embedded dies, wherein the RDL structure comprises traces connected to the active side of each flip chip die;

planarizing the panel of embedded dies to expose a back surface of each flip chip die in a back surface of the panel of embedded dies;

forming a metallization layer across the back surface of the panel of embedded dies that contacts the back surface of each flip chip die; and performing laser removal on the RDL structure to remove a portion of the RDL structure from a radio frequency (RF) sensitive area on each bumped side of each flip chip die.

12. The method of claim 11, further comprising:

placing a plurality of solder balls on contact pads in the RDL structure.

13. The method of claim 11, wherein the planarizing the panel of embedded dies comprises:

removing a back side portion from each flip chip die to expose the back surface of each flip chip die.

14. The method of claim 11, wherein the RDL structure further comprises:

a plurality of splitter circuits between the plurality of flip chip dies; and a plurality of radio frequency (RF) signal lines providing signal connections between the plurality of flip chip dies and the plurality of splitter circuits.

15. The method of claim 11, further comprising:

attaching a first side of thermal interface material (TIM) to the metallization layer of the panel of embedded dies, wherein a second side of the TIM is configured to be attached to a cooling system comprising a heat pipe.

16. The method of claim 11, further comprising:

placing a plurality of splitter dies between the plurality of flip chip dies on the temporary carrier in an active side down orientation, wherein the plurality of splitter dies is also included in the panel of embedded dies after the overmolding.

17. The method of claim 16, wherein the multi-die package is configured to be attached to a printed circuit board (PCB), wherein the PCB comprises:

a plurality of antennas, wherein each flip chip die of the multi-die package is configured to be connected to a subgroup of the plurality of antennas, and a plurality of radio frequency (RF) signal lines configured to provide signal connections between the plurality of flip chip dies and the plurality of splitter dies.

18. The method of claim 16, wherein the RDL structure further comprises:

a plurality of radio frequency (RF) signal lines providing signal connections between the plurality of flip chip dies and the plurality of splitter dies.

19. The method of claim 18, wherein the multi-die package is configured to be attached to a printed circuit board (PCB), wherein the PCB comprises:

a plurality of antennas, wherein each flip chip die of the panel of embedded dies is configured to be connected to a subgroup of the plurality of antennas.

* * * * *